(12) United States Patent
Zhao et al.

(10) Patent No.: US 9,390,993 B2
(45) Date of Patent: Jul. 12, 2016

(54) SEMICONDUCTOR BORDER PROTECTION SEALANT

(71) Applicant: Broadcom Corporation, Irvine, CA (US)

(72) Inventors: Sam Ziqun Zhao, Irvine, CA (US); Galen Kirkpatrick, Redondo Beach, CA (US); Edward Law, Ladera Ranch, CA (US); Reza Khan, Irvine, CA (US); Ming Wang Sze, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/518,947

(22) Filed: Oct. 20, 2014

(65) Prior Publication Data

US 2016/0049348 A1    Feb. 18, 2016

Related U.S. Application Data

(60) Provisional application No. 62/037,899, filed on Aug. 15, 2014.

(51) Int. Cl.
| | |
|---|---|
| *H01L 23/31* | (2006.01) |
| *H01L 21/56* | (2006.01) |
| *H01L 21/683* | (2006.01) |
| *H01L 21/78* | (2006.01) |
| *H01L 23/00* | (2006.01) |
| *H01L 21/66* | (2006.01) |
| *H01L 23/544* | (2006.01) |

(52) U.S. Cl.
CPC .......... *H01L 23/3178* (2013.01); *H01L 21/561* (2013.01); *H01L 21/565* (2013.01); *H01L 21/568* (2013.01); *H01L 21/6835* (2013.01); *H01L 21/78* (2013.01); *H01L 22/14* (2013.01); *H01L 23/3135* (2013.01); *H01L 23/544* (2013.01); *H01L 24/14* (2013.01); *H01L 24/46* (2013.01); *H01L 24/96* (2013.01); *H01L 24/95* (2013.01); *H01L 2221/68327* (2013.01); *H01L 2221/68359* (2013.01); *H01L 2224/95* (2013.01)

(58) Field of Classification Search
CPC ............................ H01L 2224/95; H01L 24/95
See application file for complete search history.

(56) References Cited

U.S. PATENT DOCUMENTS

| 4,364,164 | A | * | 12/1982 | Bluzer | ............. H01L 29/42396 |
| | | | | | 257/248 |
| 5,976,912 | A | * | 11/1999 | Fukutomi | .......... H01L 21/4803 |
| | | | | | 257/E21.502 |
| 6,607,970 | B1 | | 8/2003 | Wakabayashi | |
| 9,087,837 | B2 | * | 7/2015 | Lee | ........................ H01L 21/52 |
| 2004/0121563 | A1 | * | 6/2004 | Farnworth et al. | ............ 438/465 |

(Continued)

OTHER PUBLICATIONS

Taiwanese Office Action issued Apr. 14, 2016, in Taiwanese Patent Application No. 104113157.

*Primary Examiner* — Ida M Soward
(74) *Attorney, Agent, or Firm* — Oblon, McClelland, Maier & Neustadt, L.L.P.

(57) ABSTRACT

A semiconductor package includes a semiconductor unit containing an active circuitry layer. The semiconductor package also includes a plurality of bonding pads on the active circuitry layer, which are configured to be connected to corresponding external conductive connectors. The semiconductor package also includes a protective sealant coating filling grooved edges of the active circuitry layer. The protective sealant coating contains an exterior wafer-singulated surface.

31 Claims, 38 Drawing Sheets

(56) References Cited

U.S. PATENT DOCUMENTS

2007/0148918 A1* 6/2007 Kinsman et al. .............. 438/460
2010/0120201 A1* 5/2010 Lin et al. ...................... 438/111
2013/0127043 A1* 5/2013 Poddar et al. ................. 257/737
2013/0320530 A1* 12/2013 Koey et al. .................... 257/738
2015/0115465 A1* 4/2015 Lin et al. ...................... 257/774
2015/0348865 A1* 12/2015 Vincent .................. H01L 24/03
                                                        257/712
2016/0013122 A1* 1/2016 Jow ..................... H01L 21/4832
                                                        438/112

* cited by examiner

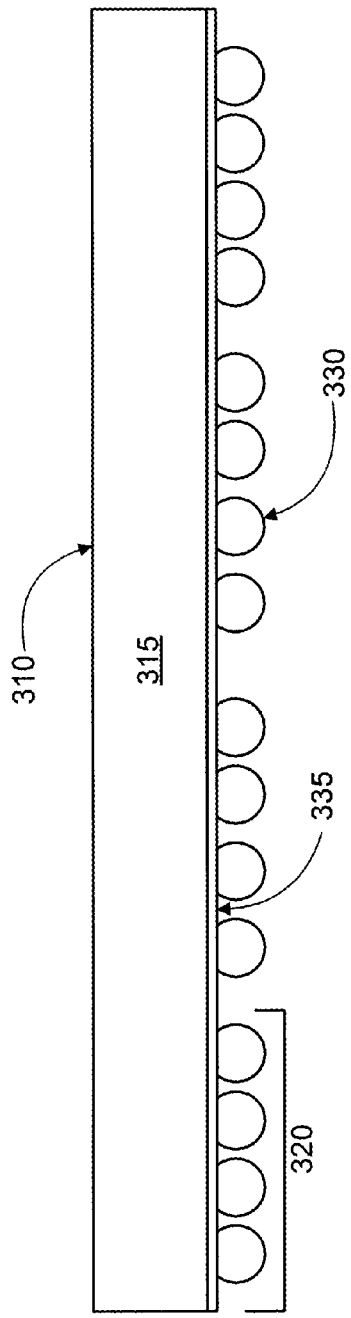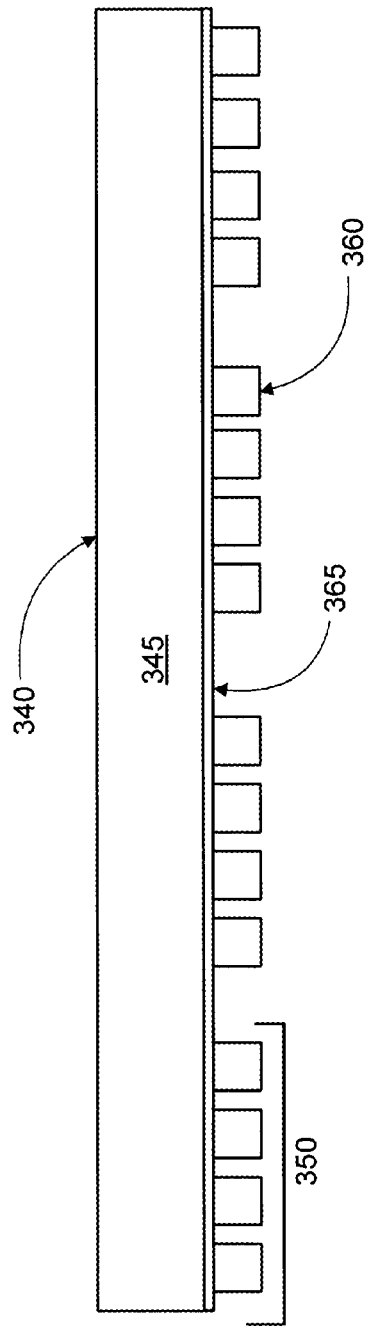

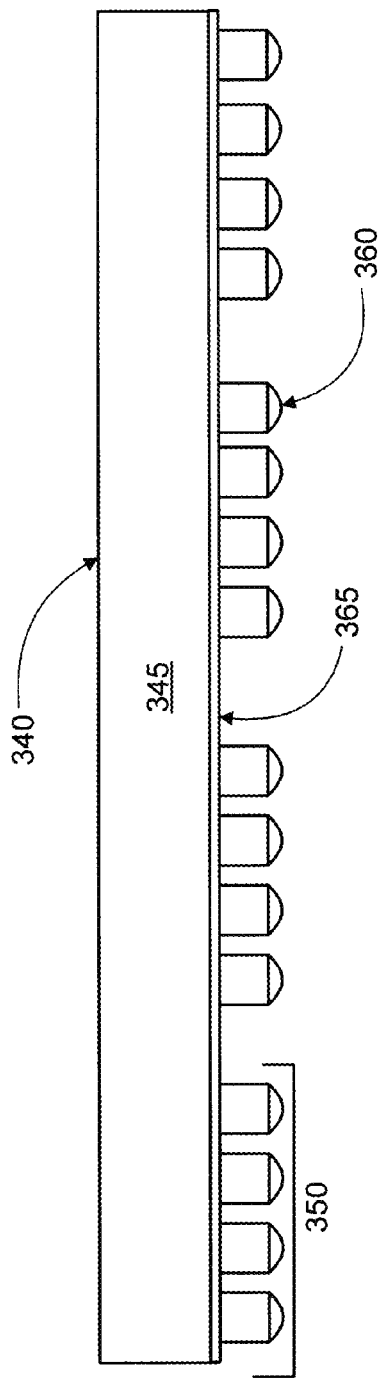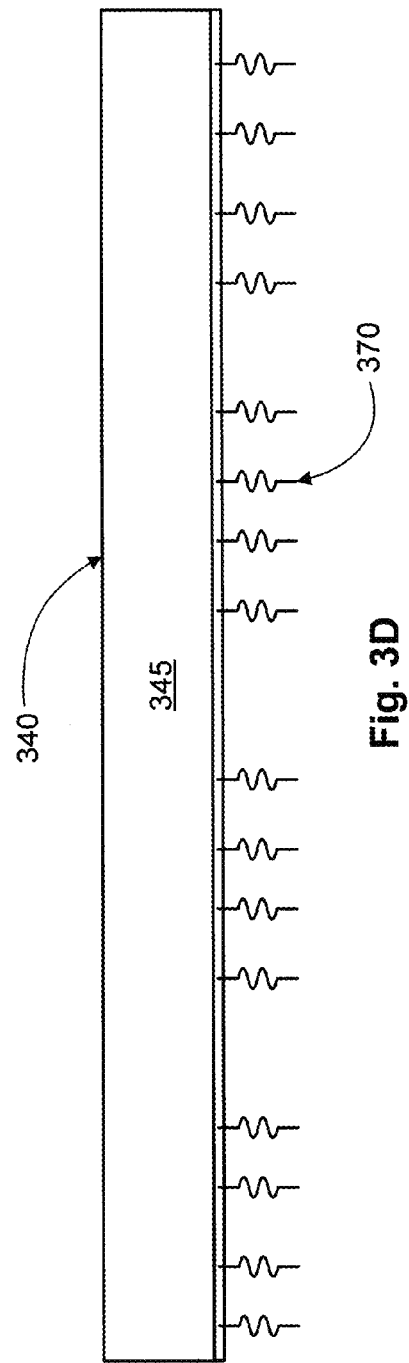

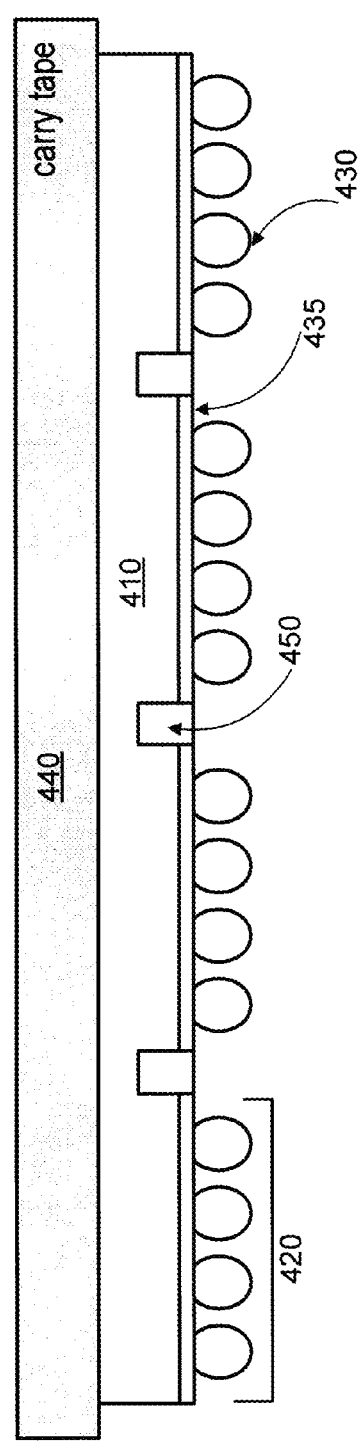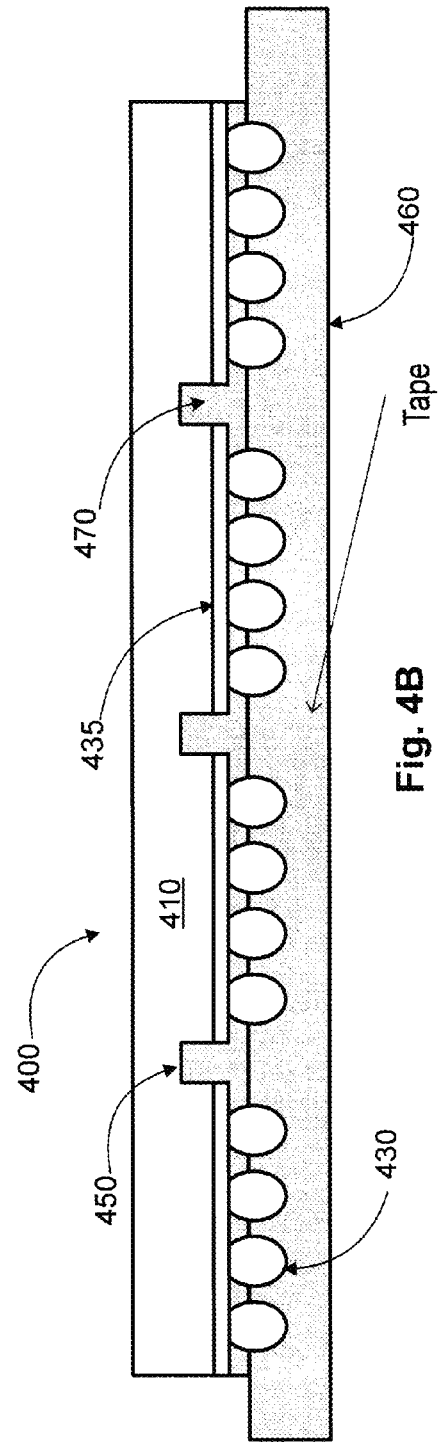
Fig. 4A
Fig. 4B

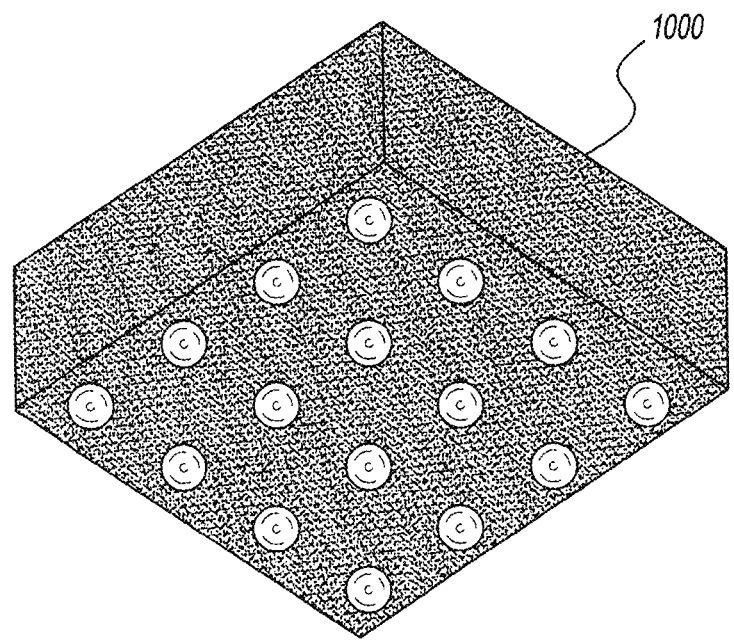
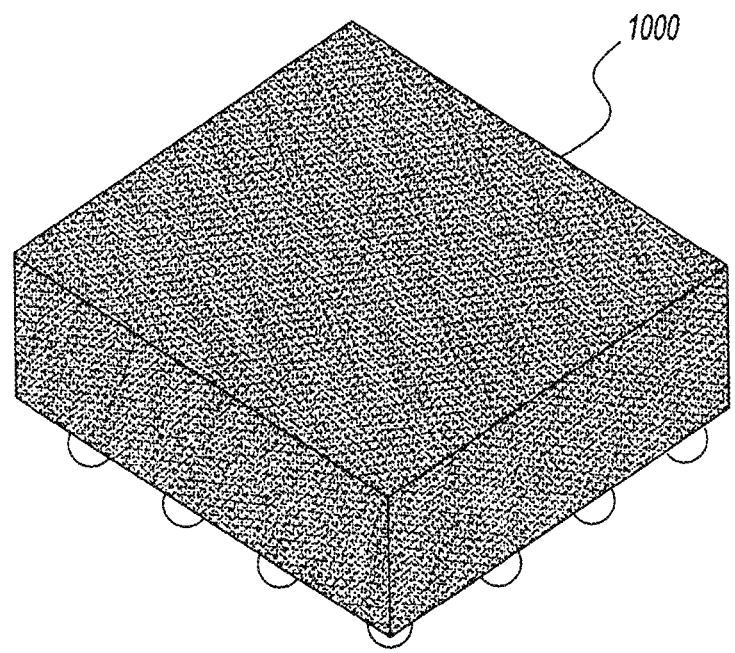
FIG. 10B

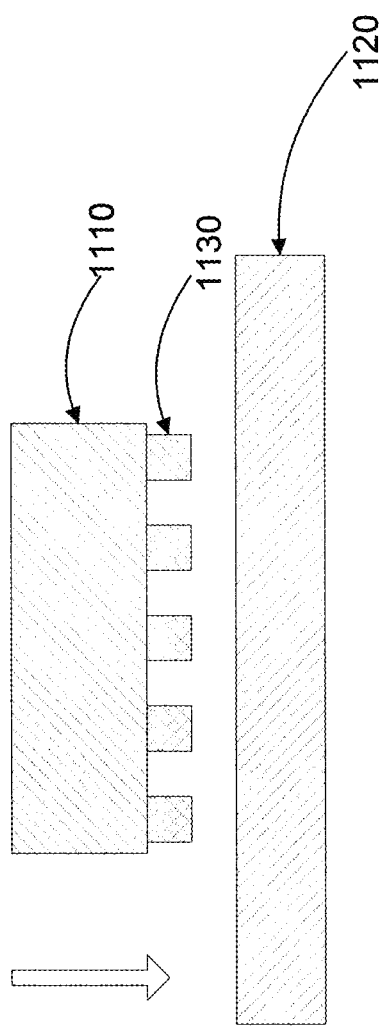

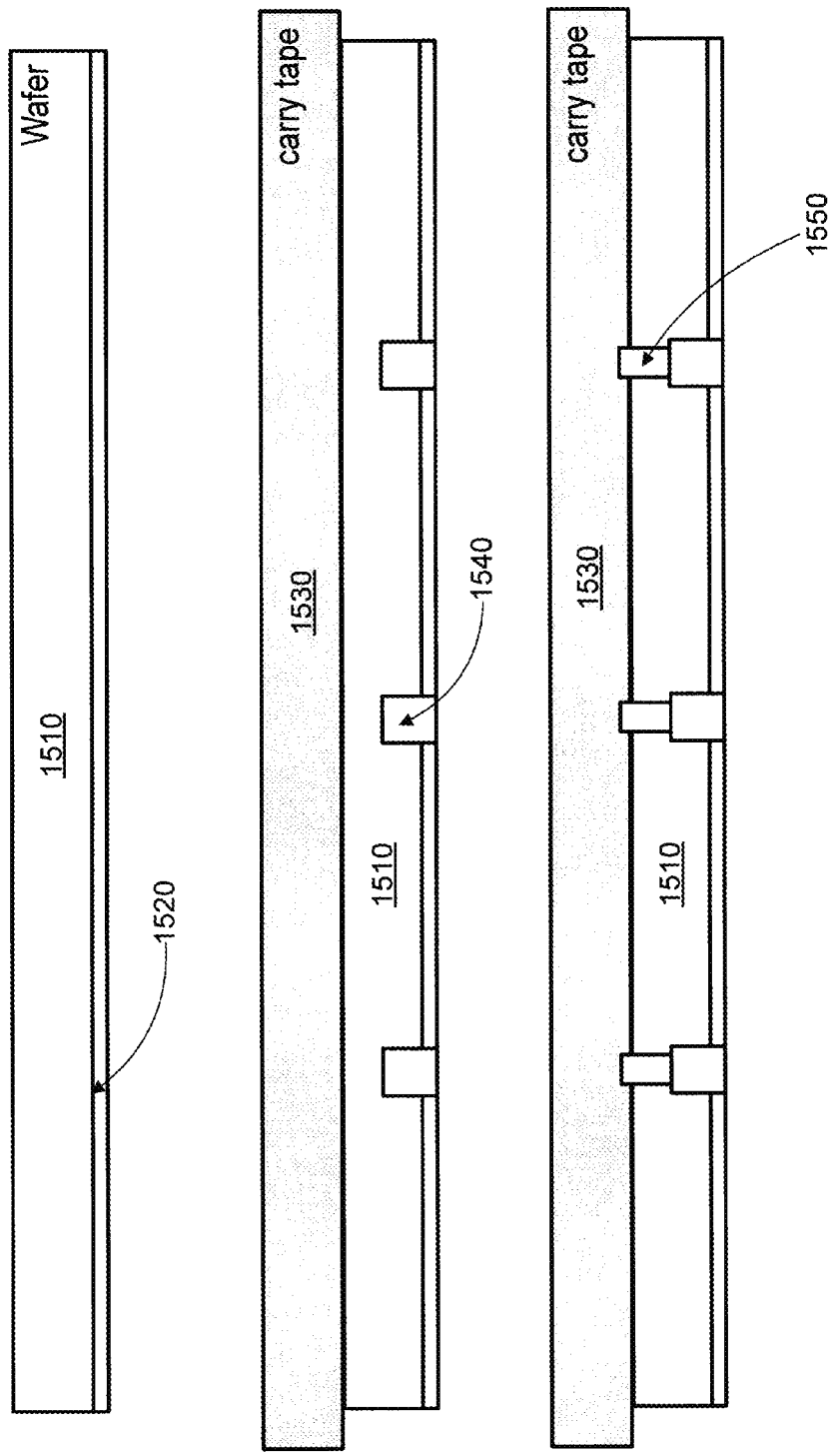

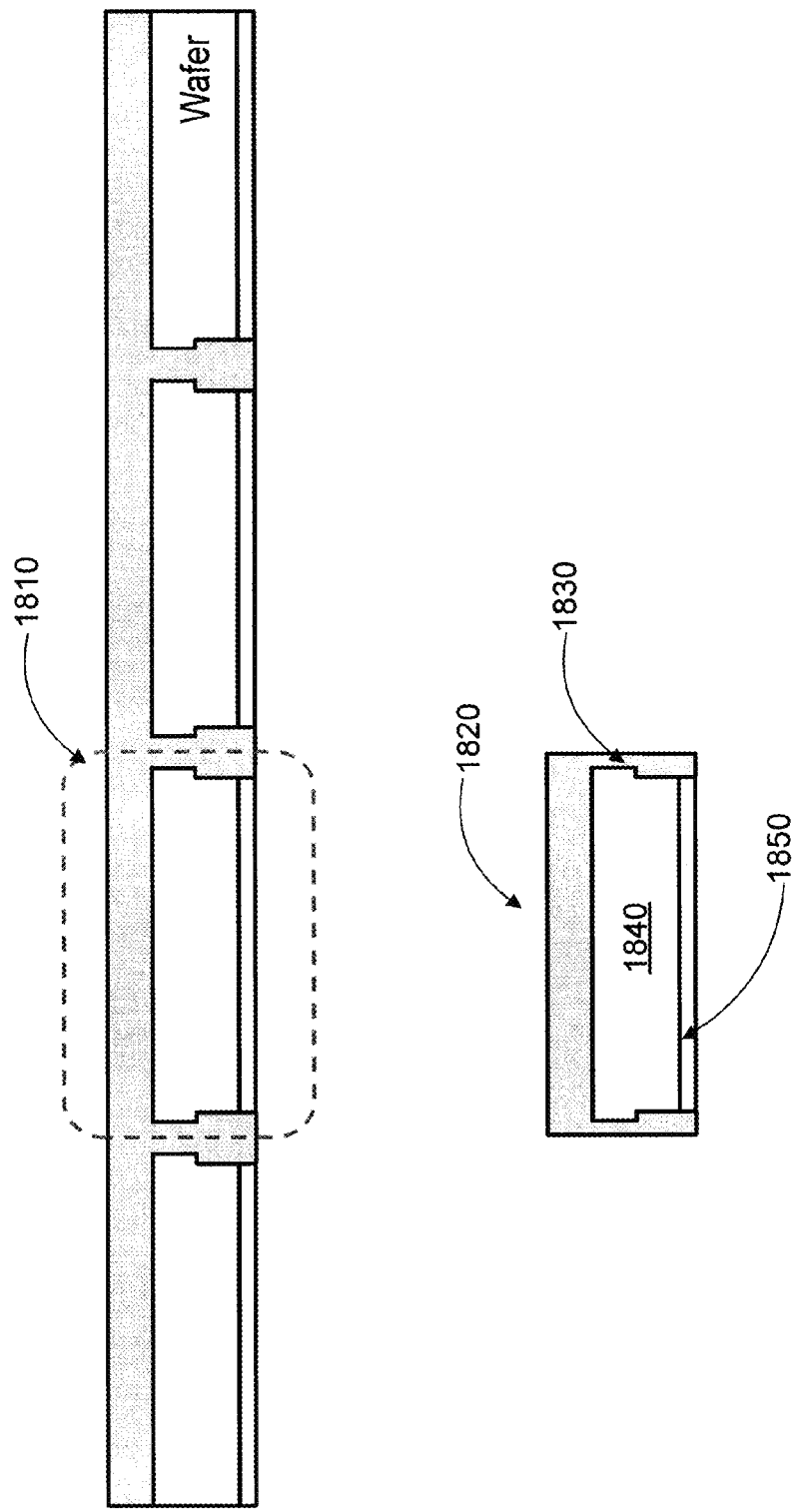

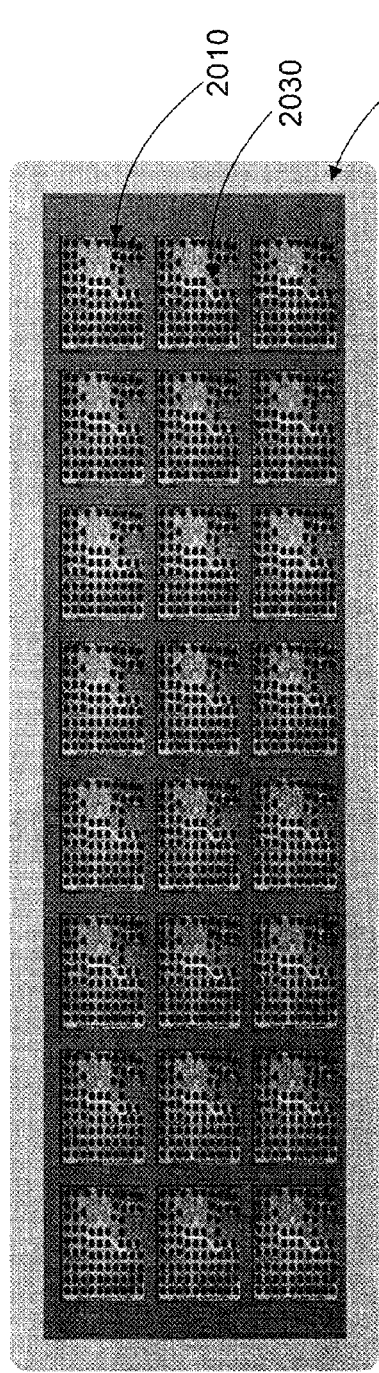
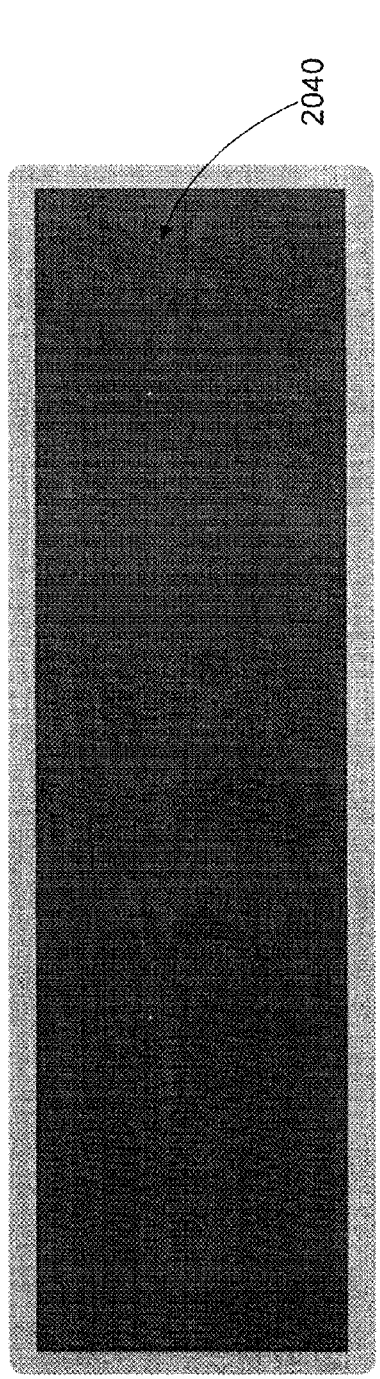
Fig. 20A
Fig. 20B

2300

Adhering a plurality of semiconductor devices to an adhesive carrier in a strip or array format, wherein the format contains a gap between each adjacent pair of semiconductor devices
S2310

↓

Applying a mold compound within the gaps, wherein the mold compound surrounds all exposed active circuitry edges
S2320

↓

Singulating the plurality of semiconductor devices through the applied mold compound
S2330

Fig. 23

SEMICONDUCTOR BORDER PROTECTION SEALANT

RELATED APPLICATIONS

This application claims priority to U.S. Provisional Application No. 62/037,899 filed Aug. 15, 2014, which is incorporated in its entirety by reference herein.

BACKGROUND

A semiconductor package can be a metal, plastic, glass, or ceramic casing containing one or more semiconductor electronic components, also referred to as dies or integrated circuits (ICs). The package provides protection against impact and corrosion, as well as environmental factors, such as moisture, oxidation, heat, and contaminants. Electrical contacts or leads emminate from the package and are connected to other devices and/or to an intermediary substrate, or directly to a circuit board. The package may have as few as two leads or contacts for devices such as diodes, or have several hundred leads or contacts in the case of a microprocessor.

The semiconductor package can be a special purpose self-contained device, which can be mounted to a printed circuit board (PCB) or a printed wiring board (PWB) of an end product. ICs can be connected to a substrate in a variety of layouts, as well as stacked in multiple layers. In addition, packages can be mounted upon other packages to form a package-on-package device. The semiconductor package can also be mounted to a flexible circuit, such as a tape.

User products are becoming more complicated with several features and functions. In addition, many user products are becoming smaller. As a result, manufacturers are utilizing packaging alternatives as a way of achieving more features and functions in a smaller area or volume.

Semiconductor packages can be completely manufactured at a wafer level, including fabricating the individual ICs, multiple level metallization, encapsulation, and attachment of solder balls (or other conductive interconnects) in a grid array configuration. The completed wafer is then singulated, i.e. separated into individual packaged ICs.

A common method of singulation is wafer sawing along saw streets between the ICs. The wafer saw completely cuts through the individual packaged ICs. However, sawing can damage the area near the cut, especially the dielectric layers and the metallization layers. In addition, the die coating can become delaminated from the metallization layers, due to damage of the seal ring during singulation. As a result, delamination can penetrate inside the seal ring of the die and cause eventual failure of the IC. Additional processing can also cause the delamination to continue propagating. Other types of singulation include stealth dicing and plasma dicing.

SUMMARY

In an embodiment, a semiconductor package includes a semiconductor unit containing an active circuitry layer. The semiconductor package also includes a plurality of bonding pads on the active circuitry layer, which are configured to be connected to corresponding external conductive connectors. The semiconductor package also includes a protective sealant coating filling all grooved edges of the active circuitry layer. The protective sealant coating contains an exterior wafer-singulated surface.

In another embodiment, a semiconductor package includes a semiconductor unit having an active circuitry surface and an inactive surface. The semiconductor package also includes a groove formed along all exposed edges of the active circuitry surface and extending partially along die edges of the semiconductor unit. The semiconductor package also includes a protective sealant coating filled within the groove and having a cut, sawed, etched, or laser modified exterior surface.

In another embodiment, a method of manufacturing a semiconductor package includes adhering a carry tape to an inactive surface of a semiconductor wafer. The method also includes cutting or etching a groove between semiconductor units of the semiconductor wafer. The groove cuts or etches through an active circuitry layer of the semiconductor wafer. The method also includes applying a protective sealant coating material into the grooves between the semiconductor units, and singulating the semiconductor units through the protective sealant coating material.

In another embodiment, a method of manufacturing a semiconductor package includes adhering a plurality of semiconductor devices to an adhesive carrier in a strip or array format. The format contains a gap between each adjacent pair of semiconductor devices. The method also includes applying a mold compound within the gaps, wherein the mold compound surrounds all exposed active circuitry edges. The method also includes singulating the plurality of semiconductor devices through the applied mold compound.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 3A-3D respectively are cross-sectional views of wafers with external connectors, according to one embodiment;

FIG. 4A is a cross-sectional view of a wafer-level ball grid array (WLBGA) with saw street grooves, according to one embodiment;

FIG. 4B is a cross-sectional view of a WLBGA with protective coating filled-saw street grooves, according to one embodiment;

FIGS. 10A-10B respectively are a cross-sectional view and a 3-D bottom and top view of a singulated semiconductor unit, according to one embodiment;

FIG. 11A is a cross-sectional view of a BGA semiconductor unit to be connected to a substrate, according to one embodiment;

FIG. 15 is a cross-sectional view of a wafer with two saw street grooves, according to one embodiment;

FIGS. 18C-18D respectively are a cross-sectional view and a 3-D bottom and top view of a singulated semiconductor unit, according to one embodiment;

FIG. 20A illustrates an array of reconstituted semiconductor devices, according to one embodiment;

FIG. 20B illustrates a mold compound over the array of reconstituted semiconductor devices, according to one embodiment;

FIG. 23 is a flowchart for a method of manufacturing a semiconductor package, according to one embodiment.

DETAILED DESCRIPTION OF THE EMBODIMENTS

Figure 1A:
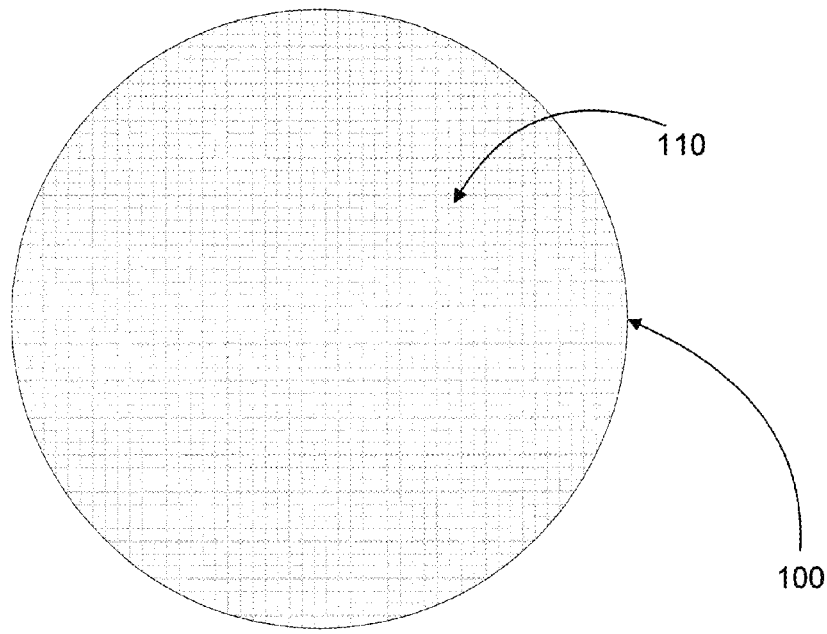
FIGS. 1A-1B respectively are illustrations of an IC wafer and an individual singulated IC, according to one embodiment.

ICs can be manufactured in wafer level form, in which 10s, 100s, or 1000s of ICs are formed within a single semiconductor wafer. The wafer material may be silicon, gallium arsenide, or other semiconducting material. Referring now to the drawings, wherein like reference numerals designate identical or corresponding parts throughout the several views, FIG. 1A illustrates a wafer 100 containing multiple ICs 110. The ICs 110 can be square or rectangular in shape, as well as other shapes suited to a particular manufacturing process.

Figure 1B:
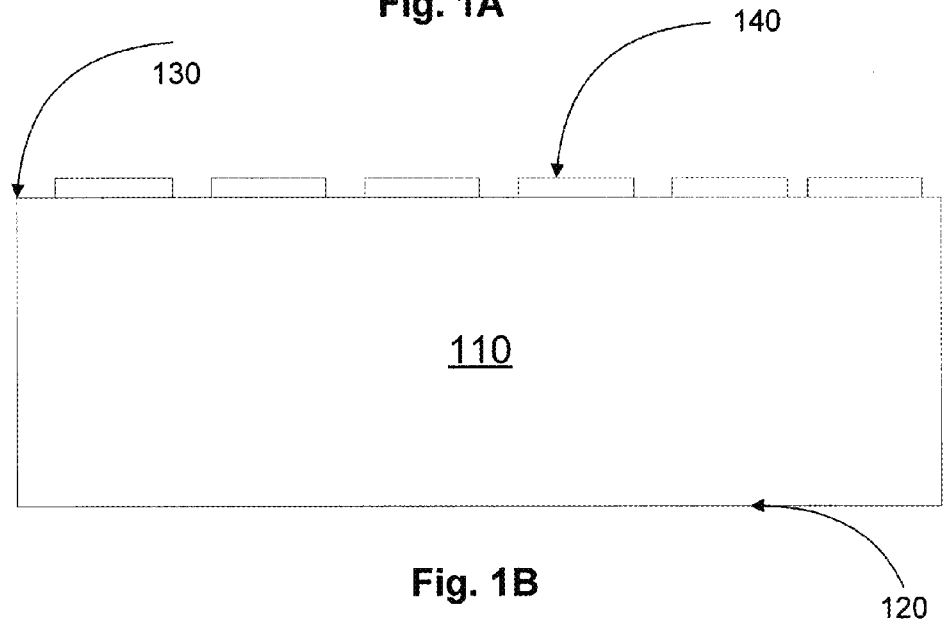

FIG. 1B illustrates a cross sectional area of an IC 110. The IC 110 has an inactive surface 120 and an active surface 130. The active surface 130 has a plurality of electrically conductive contact regions or contact pads 140, which are designed to interconnect the IC 110 with other devices or substrates. An IC contact pad 140 can have multiple layers, referred to as under-bump metallization (UBM). The base conductive layer can contain aluminum. Since solder material does not adhere well to aluminum, another metallic or conductive layer can be patterned over the aluminum pad. An example UBM includes a combination of aluminum, nickel vanadium, and copper. However, several other UBM materials are contemplated by embodiments described herein. A contact pad, referred to herein after can include a UBM layer.

Figure 2A:
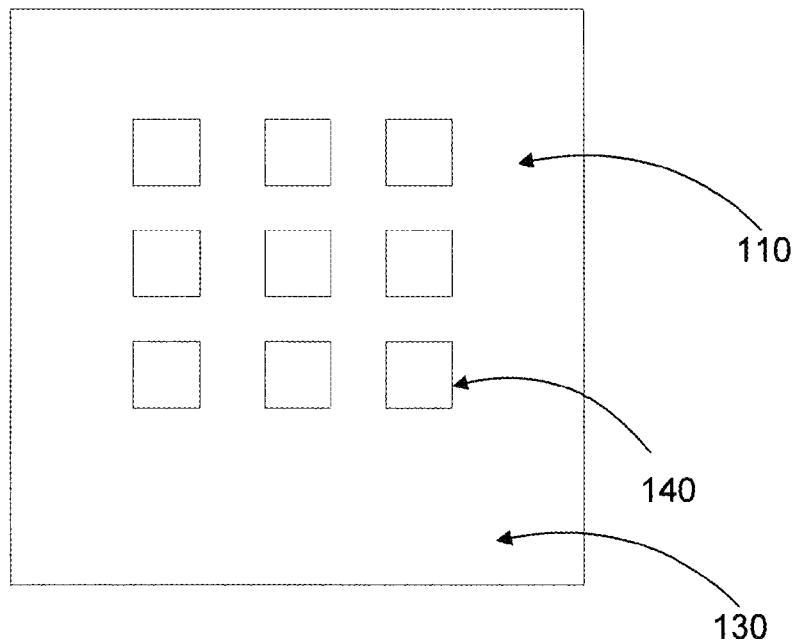
FIGS. 2A-2B are illustrations of bonding pad patterns on an active surface of an IC according to one embodiment.
Figure 2B:
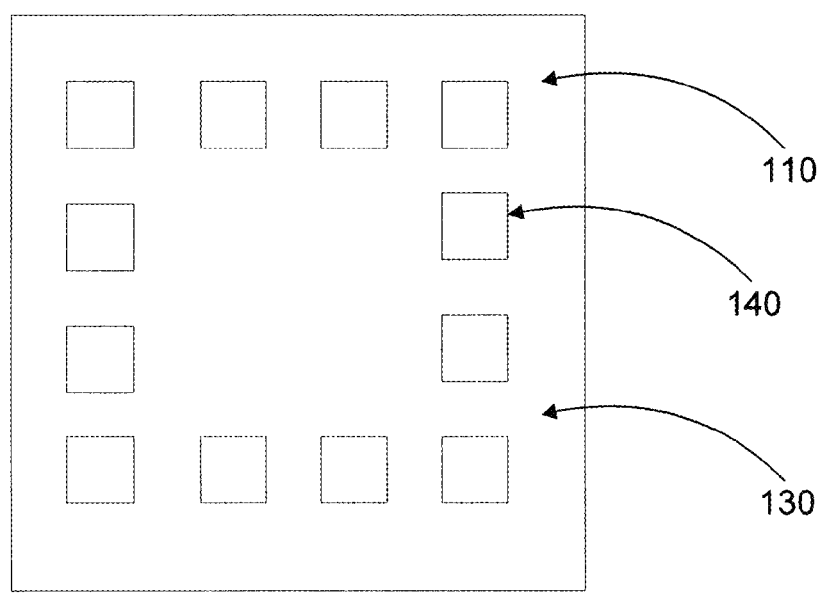

The contact pads 140 can be arranged in various configurations, depending upon the medium in which it will be connected to another device or substrate. FIG. 2A illustrates a top view of IC 110, showing multiple contact pads 140 arranged primarily in the center of the active surface 130 of the IC 110. This configuration can be used for a flip chip type of device, in which the device can have solder bumps or copper pillars connected to the contact pads 140. The flip chip device and connected solder bumps are "flipped over" and connected to contact pads of another device or substrate. FIG. 2B illustrates a top view of IC 110, showing multiple contact pads 140 arranged primarily around the perimeter of the active surface 130 of the IC 110. This configuration can be used for a wire bonded type of device. The wire bonded device is attached as stacked devices or side-by-side wire bonded devices, for example. Bonding wires connect the contact pads 140 of the wire bonded device to contact pads of another device or substrate.

FIG. 3A is a cross-sectional view of a wafer-level ball grid array (WLBGA) 310, which contains a wafer 315 and multiple semiconductor units 320. The WLBGA 310 can also be referred to as a wafer-level chip-scale package (WLCSP), in which the size of the package is the same or just slightly larger than the chip. Each semiconductor unit 320 contains an IC and a plurality of solder balls 330 on the active surface 335 of the wafer 315. FIG. 3A is a simplified view in which only four semiconductor units 320 are illustrated. A full-scale wafer 315 could have several more semiconductor units 320 in a cross-sectional view, such as the wafer 100 in FIG. 1A.

FIG. 3B is a cross-sectional view of a wafer-level pillar grid array 340, which contains a wafer 345 and multiple semiconductor units 350. Pillars 360 are located on the active surface 365 of the wafer 345. The pillars 360 are conductor pillars, which contain for example, a copper core with a solder exterior coating.

FIG. 3C illustrates external connections of copper pillars with solder caps 360. FIG. 3D illustrates wire 370 external connections.

FIG. 4A is a cross-sectional view of a WLBGA 400, containing a wafer 410 and multiple semiconductor units 420. Solder balls 430 are attached to an active surface 435 of the wafer 410 in a ball grid array (BGA). Other configurations include, but are not limited to fine-pitch ball grid arrays (FBGA), pin grid arrays (PGA), column grid arrays (CGA), land grid arrays (LGA), z-interconnect arrays, as well as others. A carry tape 440 is adhered to the back inactive surface of the wafer 410 for the purpose of keeping the semiconductor units 420 in a proper spatial layout throughout the manufacturing process. FIG. 4A also illustrates a groove or cut 450 between each of the semiconductor units 420. In an embodiment, a laser beam runs through the saw streets between each of the semiconductor units 420. The first cut 450 penetrates the active surface 435 to remove the dielectric material and the metallization within the saw street. The laser beam also cuts partially through the wafer 410. In other embodiments, plasma etching or mechanical sawing could be used for the first cut 450.

FIG. 4B is a cross-sectional view of the WLBGA 400, in which the carry tape 440 of FIG. 4A has been removed. An adhesive tape, such as carry tape 440 can be removed by mechanical de-taping or applying UV light to the carry tape 440 to deactivate the adhesive nature of the tape. Tape 460 has been adhered to the bottom surfaces of the solder balls 430. The upper surface of the tape 460 has a thick layer of adhesive in which to surround each of the solder balls 430. When a vacuum is applied in a later step, the adhesive material flows upwards to partially surround each of the solder balls 430, such that a groove is formed in the tape 460 on the bottom surface of each of the solder balls 430. However, a non-adhesive tape can also be used for tape 460. In a subsequent step, protective material 470 is filled within a gap formed between the active surface 435 of the wafer 410 and a top surface of the tape 460 to surround the exposed portions of the solder balls 430. The protective material 470 also fills the saw street grooves formed by the first cut 450. A vacuum is applied to enhance a capillary flow of the protective material 470 to reach and fill all open spaces between the wafer 410 and the tape 460 and within the grooves formed by the first cut 450.

The protective material 470 provides a protective sealant coating within the saw street grooves and along the active surfaces 435. The protective material 470 is made of a thermal set adhesive, a molding compound using film-assisted molding, or an epoxy. Other materials that provide a seal and a protective coating along surfaces of a semiconductor die are also contemplated by embodiments described herein.

In one embodiment, the solder bumps 430 are approximately 200 microns in terms of their height. The adhesive material of the tape 460 surrounds the solder balls 430 to a height of approximately 100 microns. This leaves approximately a 100-micron gap in which the protective material 470 resides between the active surfaces 435 and the tape 460. Other dimensions of a protective material 470 are contemplated by embodiments described herein, and would vary based upon a type, material, and dimension of the semiconductor device.

Figure 4C:
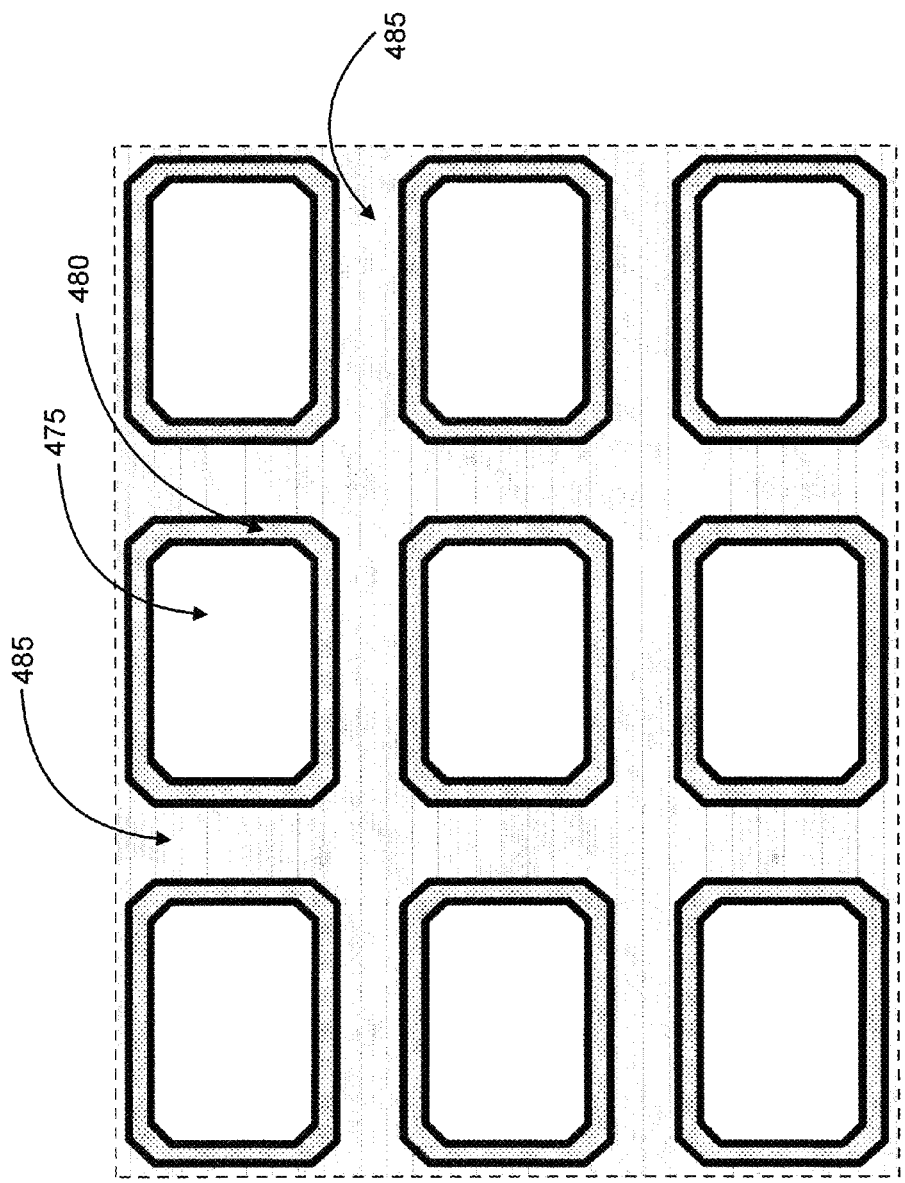
FIG. 4C is a top view of wafer-level ICs with a seal ring, according to one embodiment.

FIG. 4C illustrates a top view of some ICs in wafer-level form. FIG. 4C illustrates just a partial view of the wafer, since more ICs would likely be present on a wafer. An IC area 475 resides at the center of the structure, which is surrounded by a seal ring 480. The seal ring 480 is used to protect the IC. In an embodiment, the seal ring 480 can be made of two metal fences with metal planes on each metal layer with metal vias in between the metal planes. As an example, the two metal fences can be a few micrometers wide, such as 2-5 micrometers wide and separated by a few micrometers in between the metal fences. Scribe streets 485 reside between each IC area 475 and its seal ring 480.

Figure 4D:
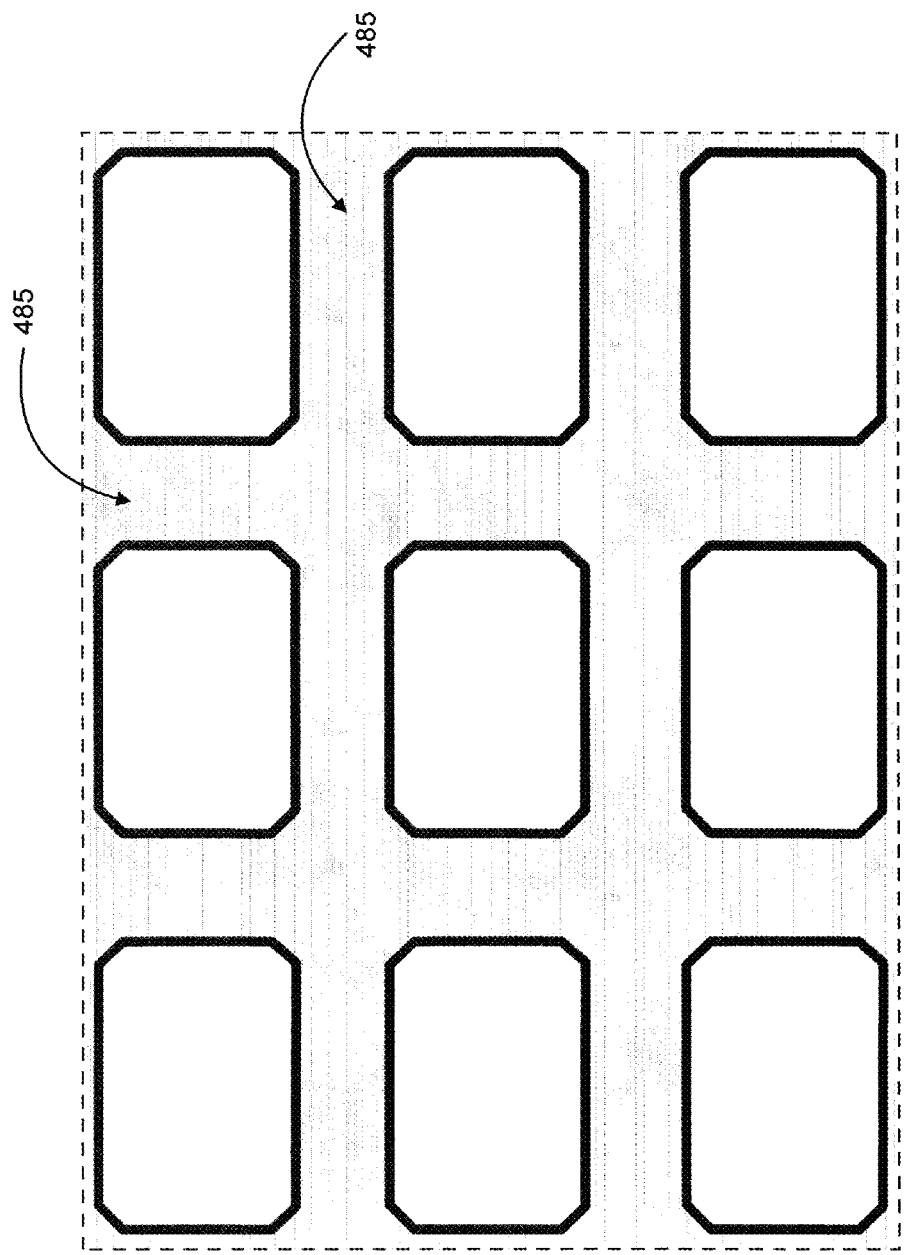
FIG. 4D is a top view of wafer-level ICs without a seal ring, according to one embodiment.

Embodiments described herein for a protective edge sealant provide a reduction or complete elimination of a seal ring, as illustrated in FIG. 4D. This provides a larger area between ICs. As a result, the ICs can be positioned closer together to utilize more of the wafer space and produce a larger number of gross die per wafer.

Figure 5A:
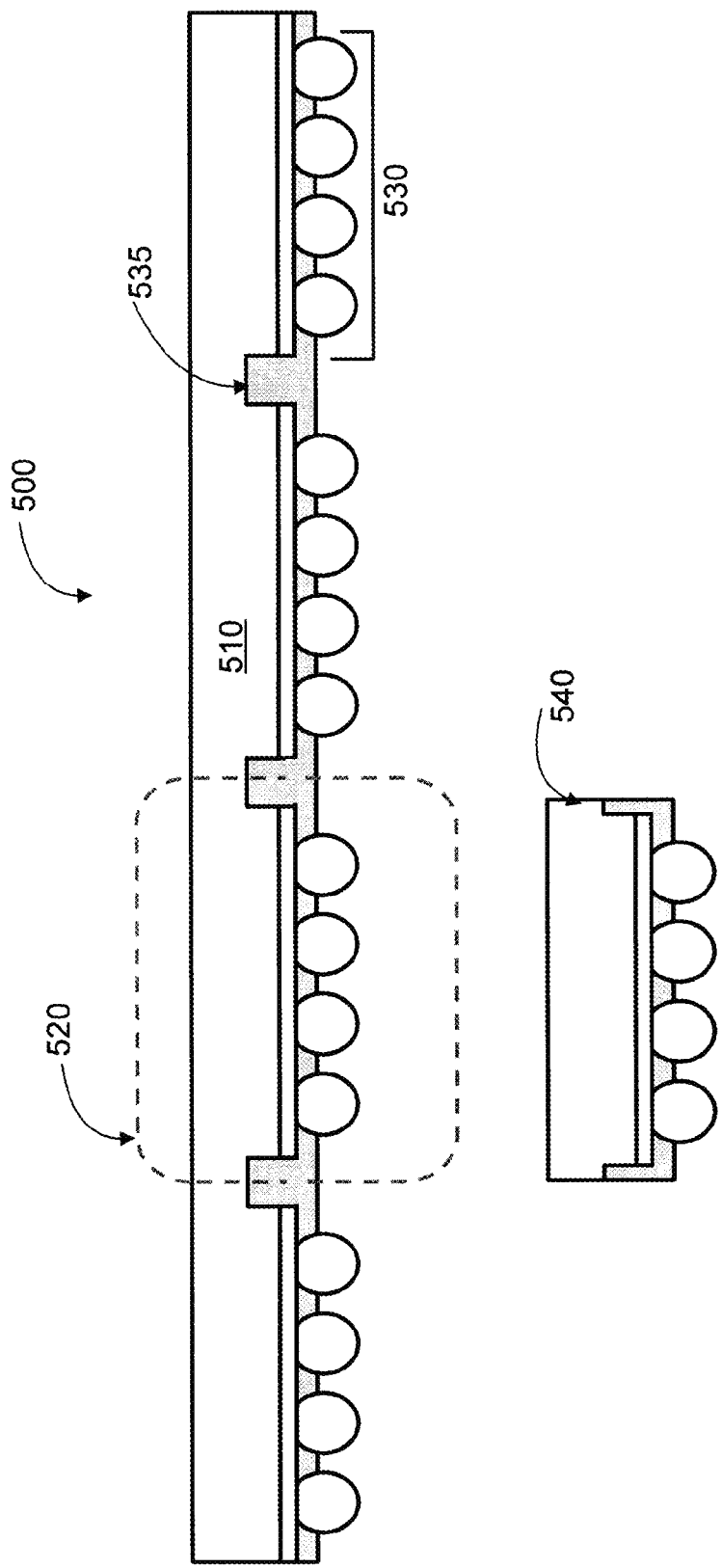
FIGS. 5A-5B respectively are a cross-sectional view and a 3-D bottom view of a singulated semiconductor unit, according to one embodiment.
Figure 5B:
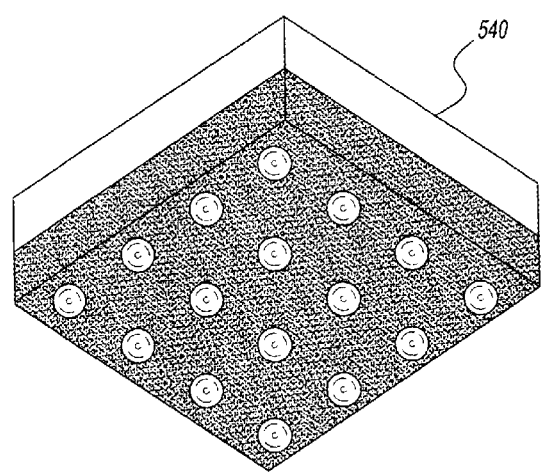

In FIG. 5A, the tape 460 of FIG. 4B has been removed, and the wafer 510 is singulated in a second cut 520 between the semiconductor units 530. A saw cuts through the protective material 535 between the semiconductor units 530, and also cuts through the remainder of the wafer 510 to completely singulate the semiconductor units 530 apart from one another. Since protective material 535 exists on the active surface, as well as within the grooves, the wafer saw does not damage the dielectric or metallization layers when the second cut 520 is executed. The resulting singulated package 540 has protective material formed part-way up all four side edges of the die and on the active surface surrounding each of the solder balls. FIG. 5B is a bottom 3-dimensional view of the singulated package 540.

Figure 6:
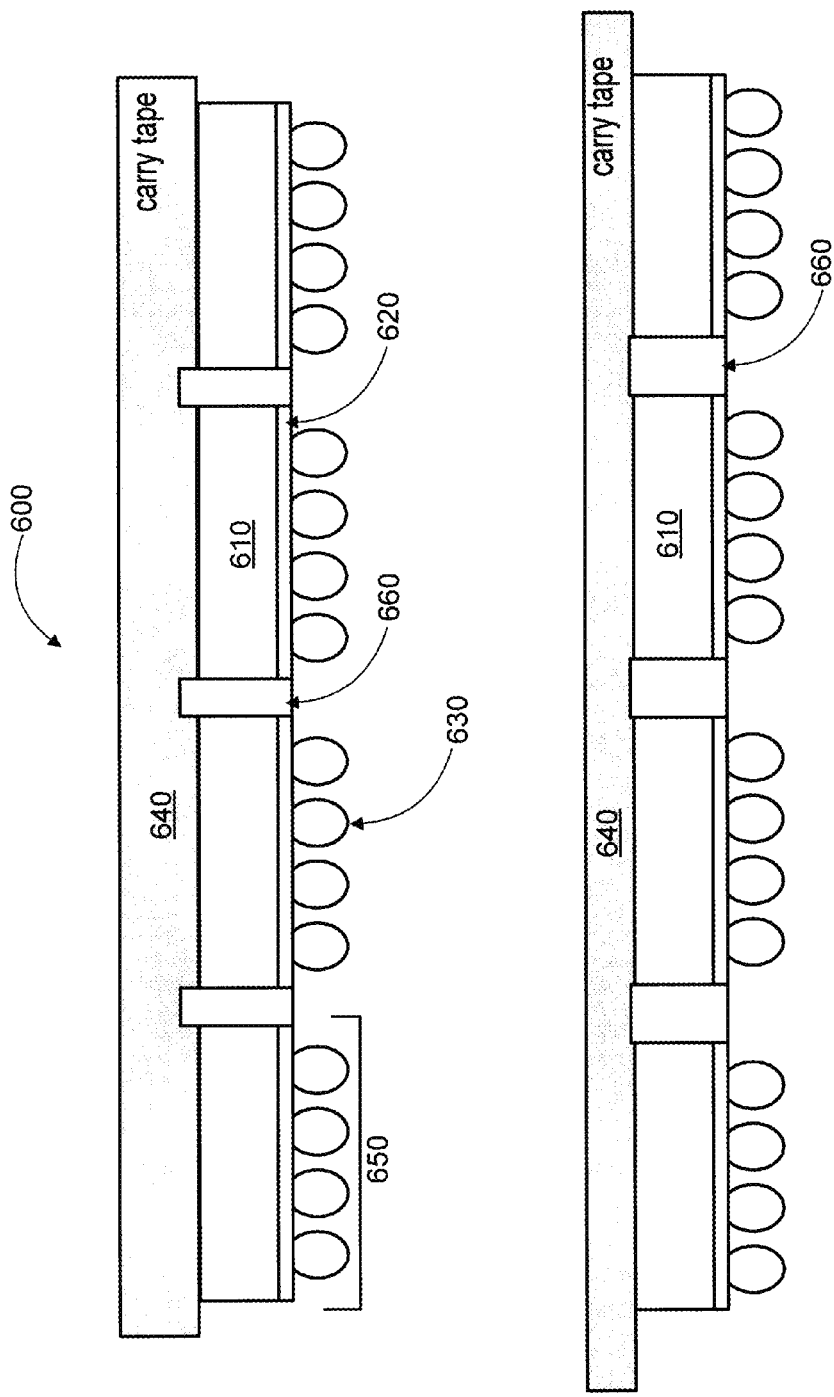
FIG. 6 is a cross-sectional view of a full wafer cut into semiconductor units, according to one embodiment.

FIG. 6 is a cross-sectional view 600 of another embodiment, which illustrates a wafer 610 having an active surface 620, and solder balls 630 connected to the active surface 620. The inactive surface of the wafer 610 is adhered to a carry tape 640 in order to maintain the spatial layout of the semiconductor units 650 following singulation. A first cut 660 is made in which the wafer 610 is partially cut, such as that illustrated in FIG. 4A. The first cut 660 can be made by laser grooving, for example. An example of a first cut is 50-70 microns in width. However, other dimensions are contemplated by embodiments described herein to accommodate different types, materials, and sizes of semiconductor units 650. A second cut is made within the saw street grooves to completely cut through the wafer 610. The second cut extends into the carry tape 640, but does not cut completely through the carry tape 640. The second cut can be made by a mechanical saw. Alternately, a single cut can be made by plasma etching or mechanical sawing instead of two individual cuts.

The carry tape 640 maintains the spatial layout of the semiconductor units 650, and is adhered to a wafer rim (not illustrated) to provide a rigid frame. A further embodiment includes expanding the carry tape 640, i.e. stretching the carry tape 640, which can be executed by pressing against the back side of the carry tape 640 within the wafer rim. This provides a larger gap between the semiconductor units 650 by as much as two times the width, i.e. 100-140 microns, as illustrated in the bottom drawing of FIG. 6. This results in a larger gap being provided without the need to actually saw that large of a cut. In this example, a cut of 50-70 microns is made, but a width of 100-140 microns is realized.

Figure 7:
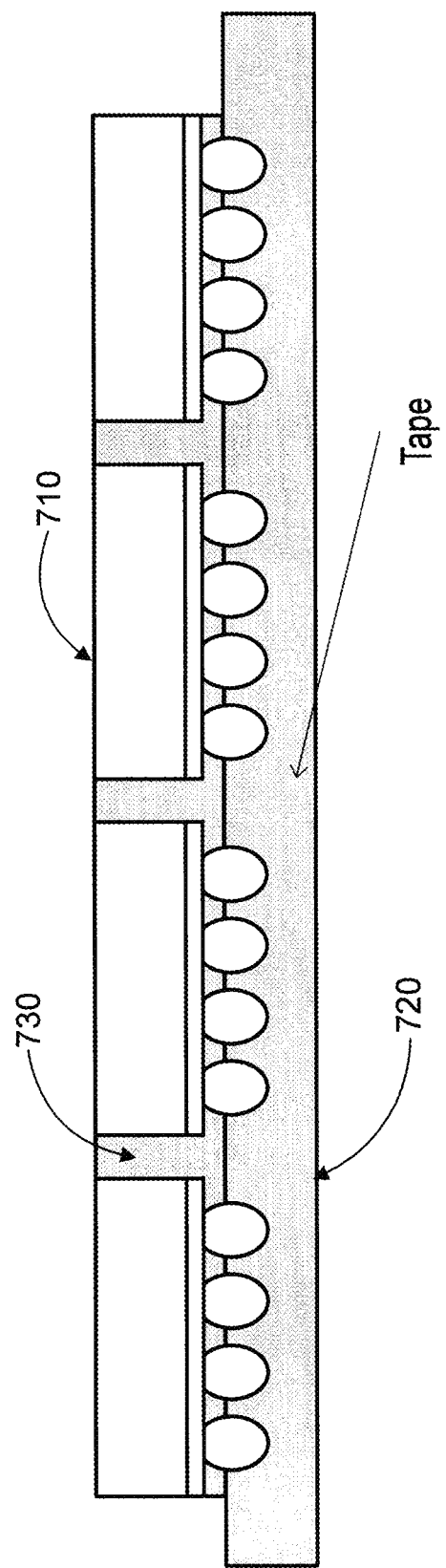
FIG. 7 is a cross-sectional view of protective coating filled between semiconductor units, according to one embodiment.

FIG. 7 is a cross-sectional view that illustrates the absence of the carry tape 640 from FIG. 6. Another tape 720 is adhered to the bottom surfaces of the solder balls of the semiconductor units 710. The semiconductor units 710 adhered to the tape 720 could be the same semiconductor units and the same layout from FIG. 6, or the semiconductor units 710 could be a few select units that are adhered to the tape 720 for further processing. Tape 720 can be an adhesive tape or a non-adhesive tape which surrounds the solder balls. A protective coating 730 is filled from an upper position of the semiconductor units 710 into the saw street grooves, and on the active surfaces between the semiconductor units 710 and the tape 720. Alternately, the protective coating 730 is filled from a lower surface of the semiconductor units 710 while the top surfaces are still adhered to the carry tape 640 illustrated in FIG. 6.

Figure 8A:
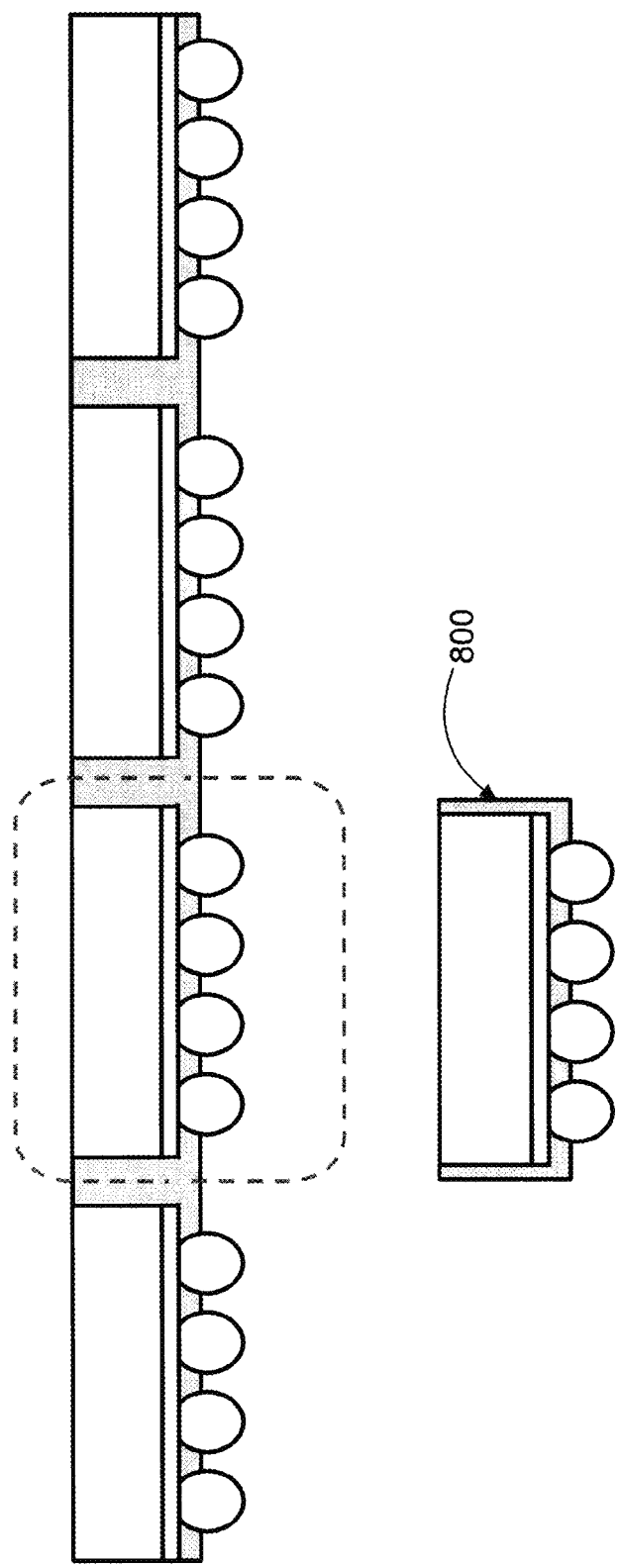
FIGS. 8A-8B respectively are a cross-sectional view and a 3-D bottom view of a singulated semiconductor unit, according to one embodiment.
Figure 8B:
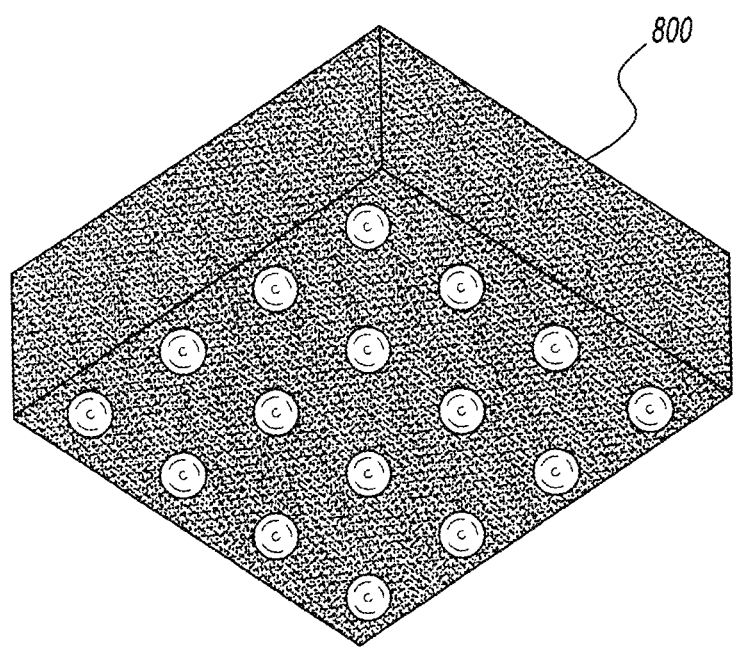

In FIG. 8A, the protective coating is cut between each adjacent die, but does not cut through any active circuitry of the semiconductor units. The singulated semiconductor unit 800 has a protective coating on the entire surface of all four side edges, in addition to having the protective coating on the active surface surrounding the solder balls. FIG. 8B is a bottom 3-dimensional view of the singulated semiconductor unit 800.

Figure 9:
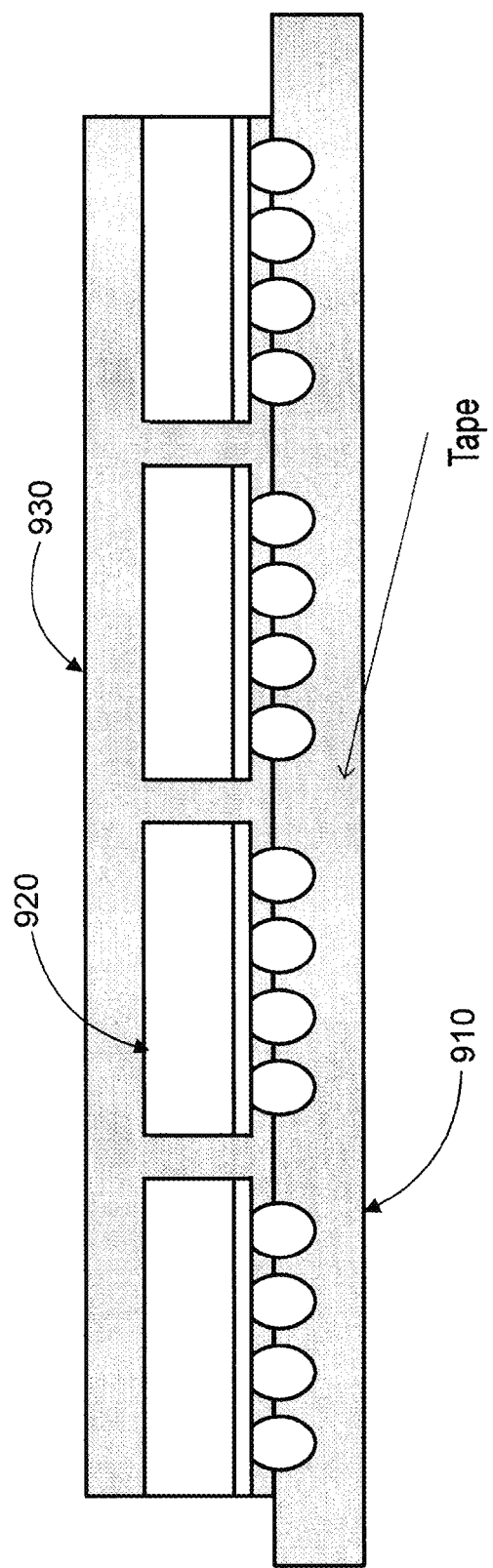
FIG. 9 is a cross-sectional view of protective coating filled between and on top of semiconductor units, according to one embodiment.

FIG. 9 is a cross-sectional view of adhesive tape 910 adhered to four semiconductor units 920 after processing similar to embodiments described above. Tape 910 can also be a non-adhesive tape in which the tape surrounds the solder balls. Protective material 930 is filled between and on top of the semiconductor units 920. The protective material 930 also fills the gap between each semiconductor unit 920 and the adhesive tape 910.

Figure 10A:
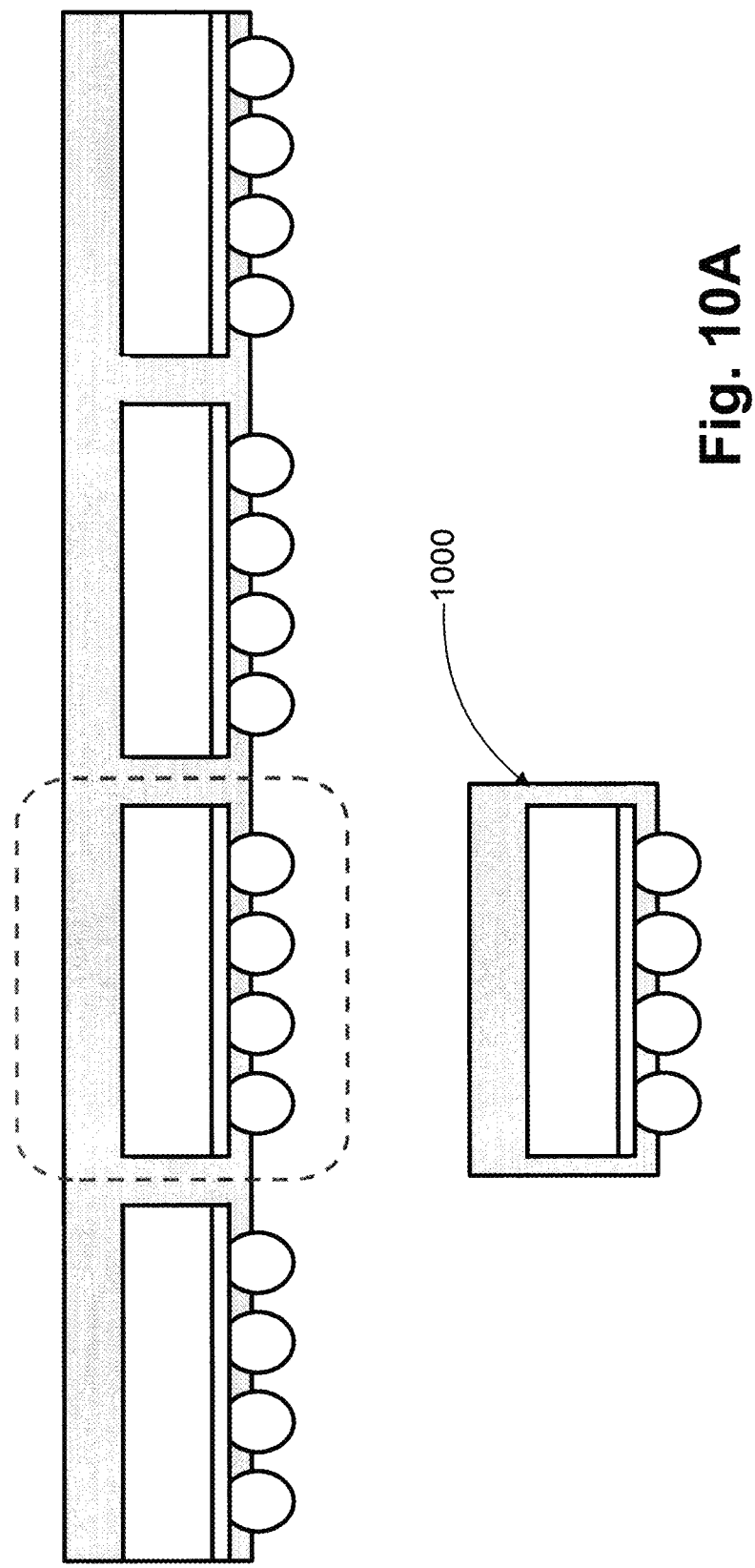

FIG. 10A is a cross-sectional view illustrating the singulation of the four semiconductor units. The saw streets filled with protective material is cut, but the active circuitry of the semiconductor units is not cut. The final packaged semiconductor unit 1000 is completely surrounded by protective material, except for the lower surfaces of the solder balls. FIG. 10B is a bottom and top 3-dimensional view of the packaged semiconductor unit 1000.

Embodiments described with reference to FIG. 3A-FIG. 10 were directed to a flip chip type of device in which solder balls, pillars, or columns are connected to the active surface of the semiconductor unit. FIG. 11A is a block diagram illustrating an IC 1110 having solder bumps 1130 on the active surface of the IC 1110. The IC 1110 is "flipped over" such that the active surface is on a lower edge. This allows the solder bumps 1130 to be directly connected to another device or substrate, such as substrate 1120. Although not illustrated, substrate 1120 has contact pads on its upper surface that match a pattern of the solder bumps 1130 on the IC 1110. The solder bumps 1130 are brought into contact with the contact pads of the substrate 1120 and raised to a temperature at which the solder bumps 1130 begin to reflow or liquefy. When the temperature is lowered, the reflowed solder bumps 1130 solidify, and become electrically and mechanically connected to the contact pads on the substrate 1120.

The embodiments described above with reference to FIG. 3A-FIG. 5 were processed having the solder balls connected to an active circuitry layer early in the process, prior to forming and filling the saw streets and prior to singulation of the semiconductor units. Alternately, the formation and filling of the saw streets could be executed first, and the solder balls or other conductive structures could be connected to the semiconductor units near the end of the processing.

An alternative embodiment will now be described, with reference back to FIGS. 3A-5. The wafers 315 and 345 of FIGS. 3A-3B do not have the solder balls 330 or the conductor pillars 360 connected to the wafers at this point in this alternative embodiment. A carry tape 440 is adhered to the back surface of the wafer 410 in FIG. 4A, and a first cut 450 is made in saw streets in the active surface of wafer 410. The tape 460 in FIG. 4B is not used in this alternative embodiment. Instead, the protective coating 470 is filled within the saw streets 450, and also completely covers the active surface of the wafer 410. A solder mask or solder stencil is applied over the protective coating which covers the active circuitry layer, prior to singulating the semiconductor units. The solder mask can be made of a polymer or photoimageable material, which can be patterned when exposed to ultraviolet (UV) light. A solder mask containing a plurality of openings that match the contact pads on the active surface of the semiconductor units is placed over the protective coating on the wafer. UV light exposes the protective coating through the openings in the solder mask. The solder mask is subsequently removed, and exposed areas of the protective coating are removed. The solder balls are placed within the openings of the protective coating over the contact pads, either before or after the singulation illustrated in FIG. 5. The solder balls are reflow-connected to the contact pads of the semiconductor units.

Figure 11B:
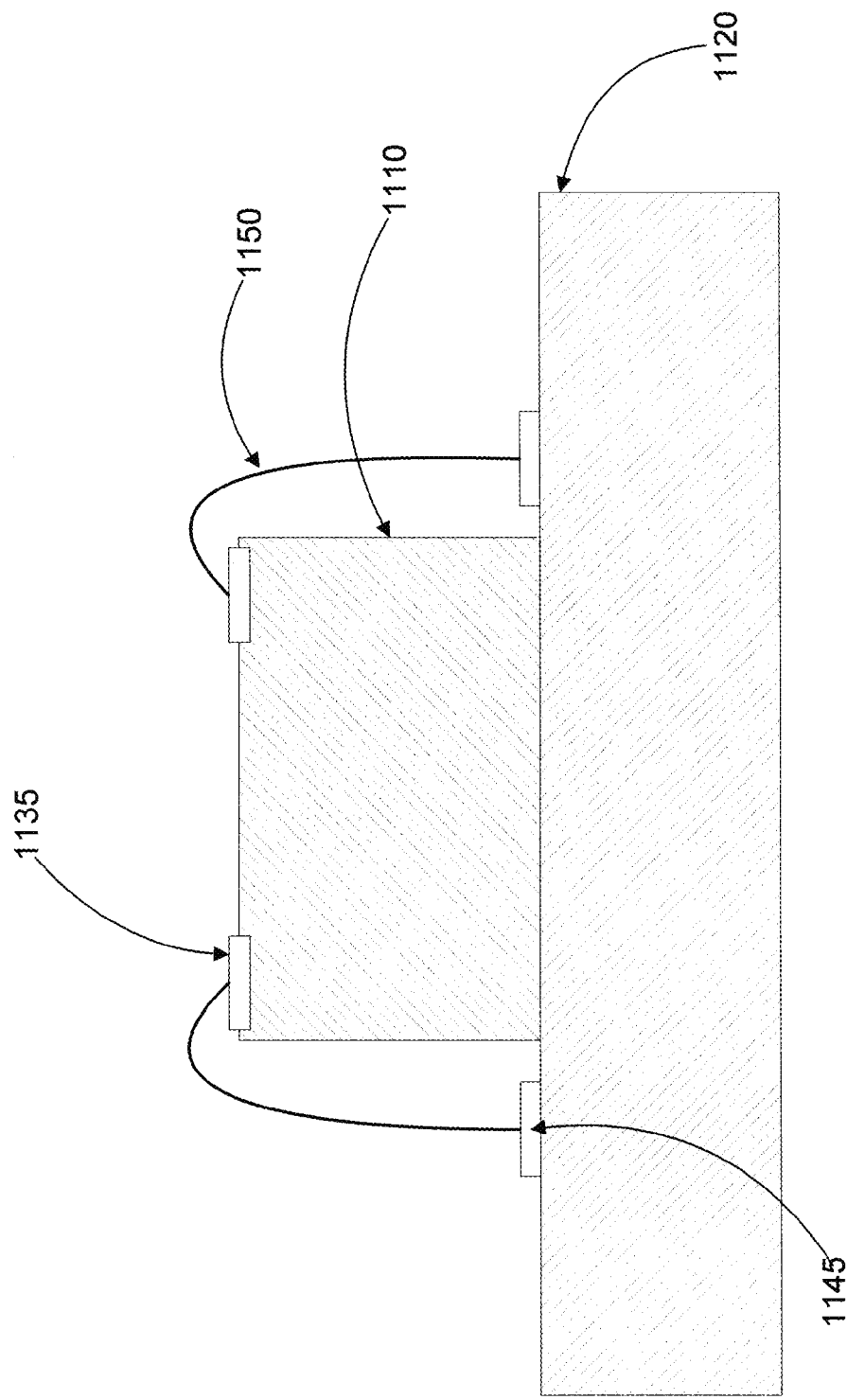
FIG. 11B is a cross-sectional view of a wire-bonded semiconductor unit connected to a substrate, according to one embodiment.

FIG. 11B is a block diagram illustrating another type of device, referred to as a wire-bonded device. The IC 1110 is positioned upright, relative to an adhesively connected substrate 1120. The upper active surface contains bonding pads 1135, which are connected to bonding pads 1145 of the substrate 1120 by bonding wires 1150. FIG. 11B illustrates just one embodiment for a wire-bonded device. Several other configurations for wire bonding to other devices and/or other types of substrates are contemplated by embodiments described herein.

Figure 12A:
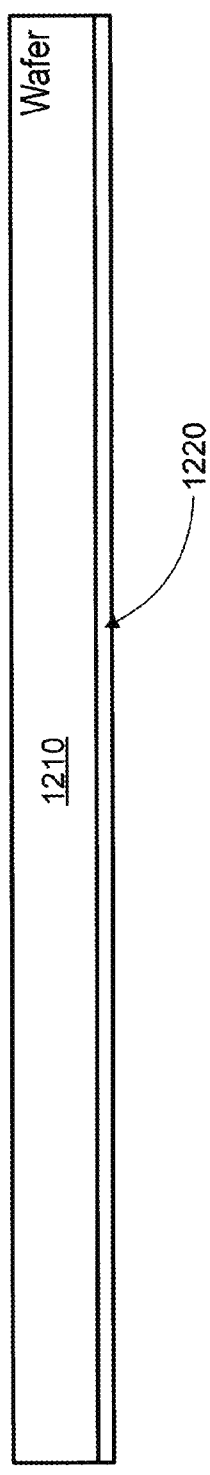
FIG. 12A is a cross-sectional view of a wafer, according to one embodiment.
Figure 12B:
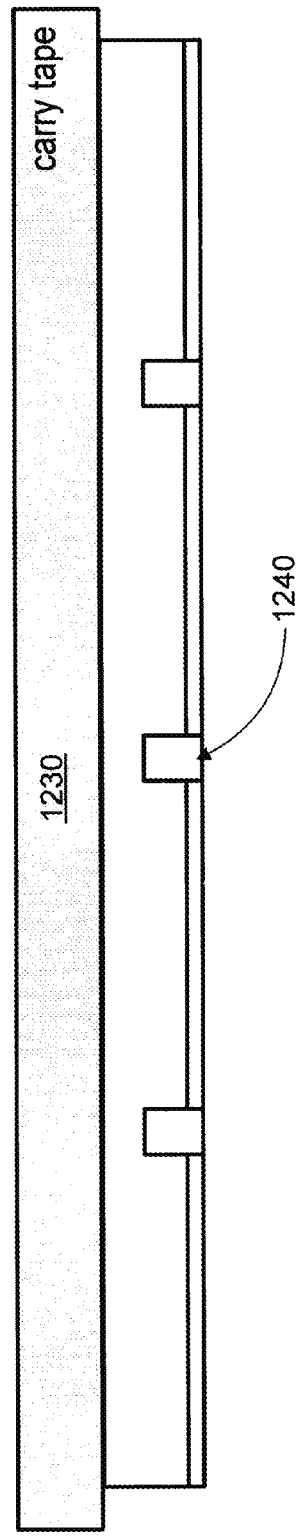
FIG. 12B is a cross-sectional view of a wafer with saw street grooves, according to one embodiment.

Embodiments will now be described for ICs that are subsequently intended for wire bonding. FIG. 12A illustrates a semiconductor wafer 1210, which contains an active circuitry layer 1220. To prepare the wafer for wafer cutting, a carry tape 1230 is adhered to the inactive surface of the wafer 1210, as illustrated in FIG. 12B. Wafer cuts or grooves 1240 are formed through saw streets of the wafer 1210. The wafer cuts or grooves 1240 can be formed by laser grooving, plasma etching, or mechanical sawing. In one embodiment, the wafer cuts or grooves 1240 remove any passivation layer, metallization layers, and interlayer dielectric materials from the saw streets, and partially cut through the silicon substrate.

Figure 13A:
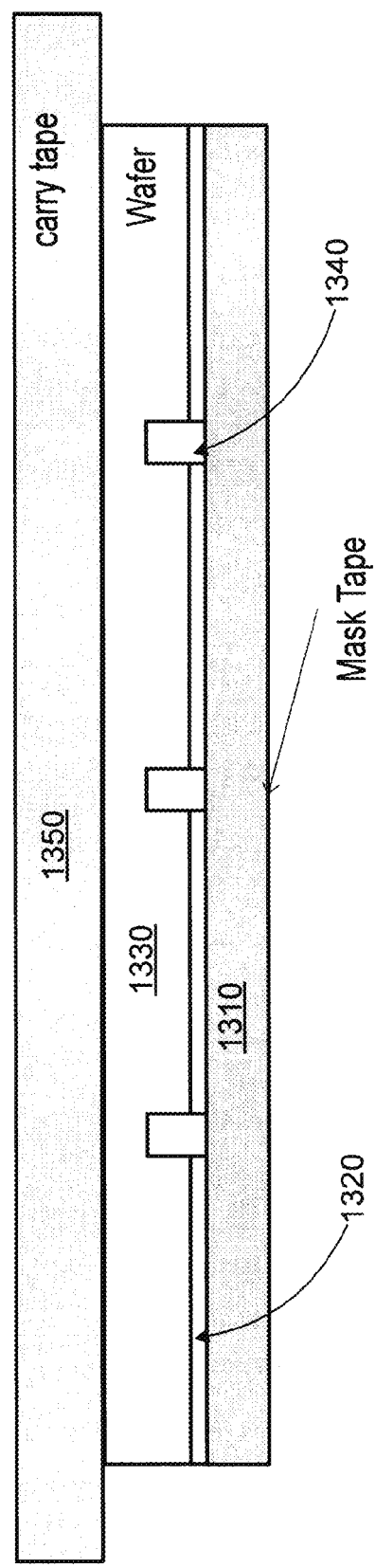
FIG. 13A is a cross-sectional view of a wafer with saw street grooves and an attached mask tape, according to one embodiment.
Figure 13B:
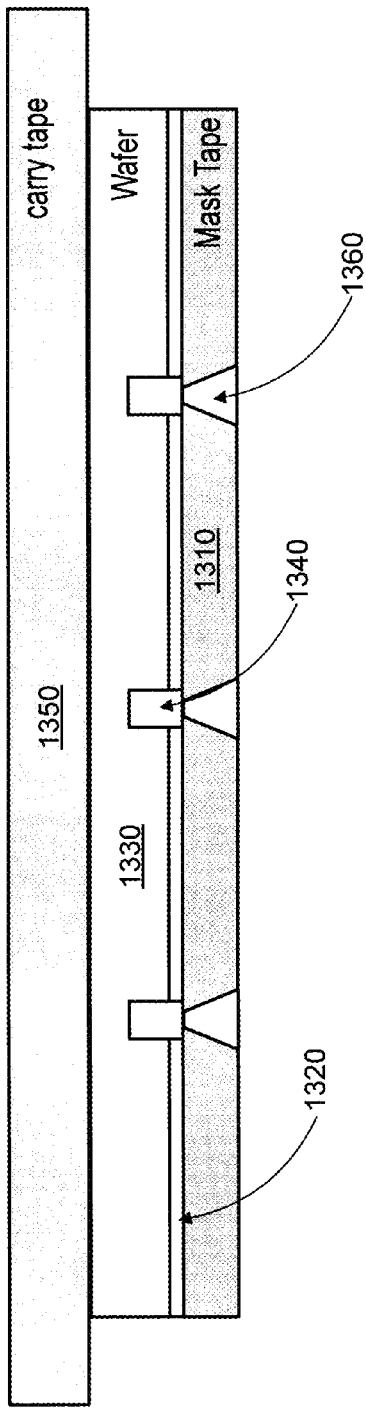
FIGS. 13B-13C respectively are cross-sectional views of a patterned mask tape and protective filled grooves of a wafer, according to one embodiment.

FIG. 13A illustrates the application of a mask tape 1310 to the active surface 1320 of the wafer 1330, in preparation for filling the saw streets 1340. A carry tape 1350 is still adhered to the inactive surface of the wafer 1330. FIG. 13B illustrates the formation of openings 1360 within the mask tape 1310 directly above the saw streets 1340. The openings 1360 can be formed by laser patterning, such as laser writing or etching. The openings 1360 can partially expose the saw streets 1340, as illustrated in FIG. 13B, or the openings 1360 can completely expose the saw streets 1340.

Figure 13C:
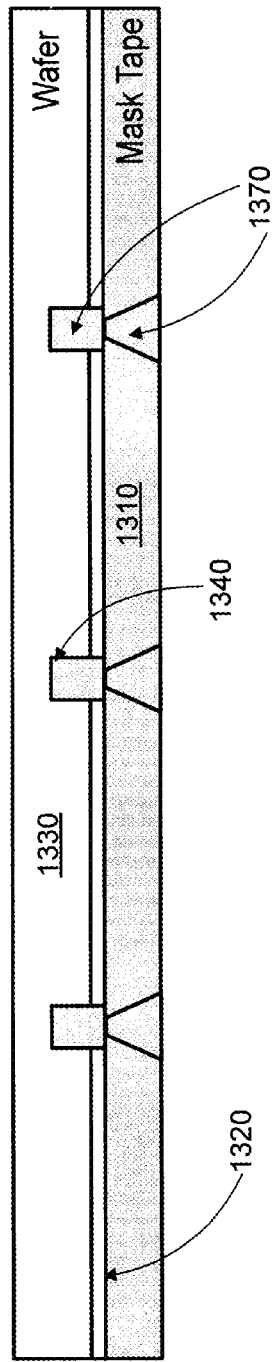

FIG. 13C illustrates filling the saw streets 1340 with a protective sealant fill material 1370. The protective sealant fill material 1370 includes, but is not limited to a molding compound, a thermoset epoxy, a resin, or an adhesive. The filling process includes, but is not limited to molding, vacuum molding, immersion coating, spray coating, and spin-on coating.

Figure 14A:
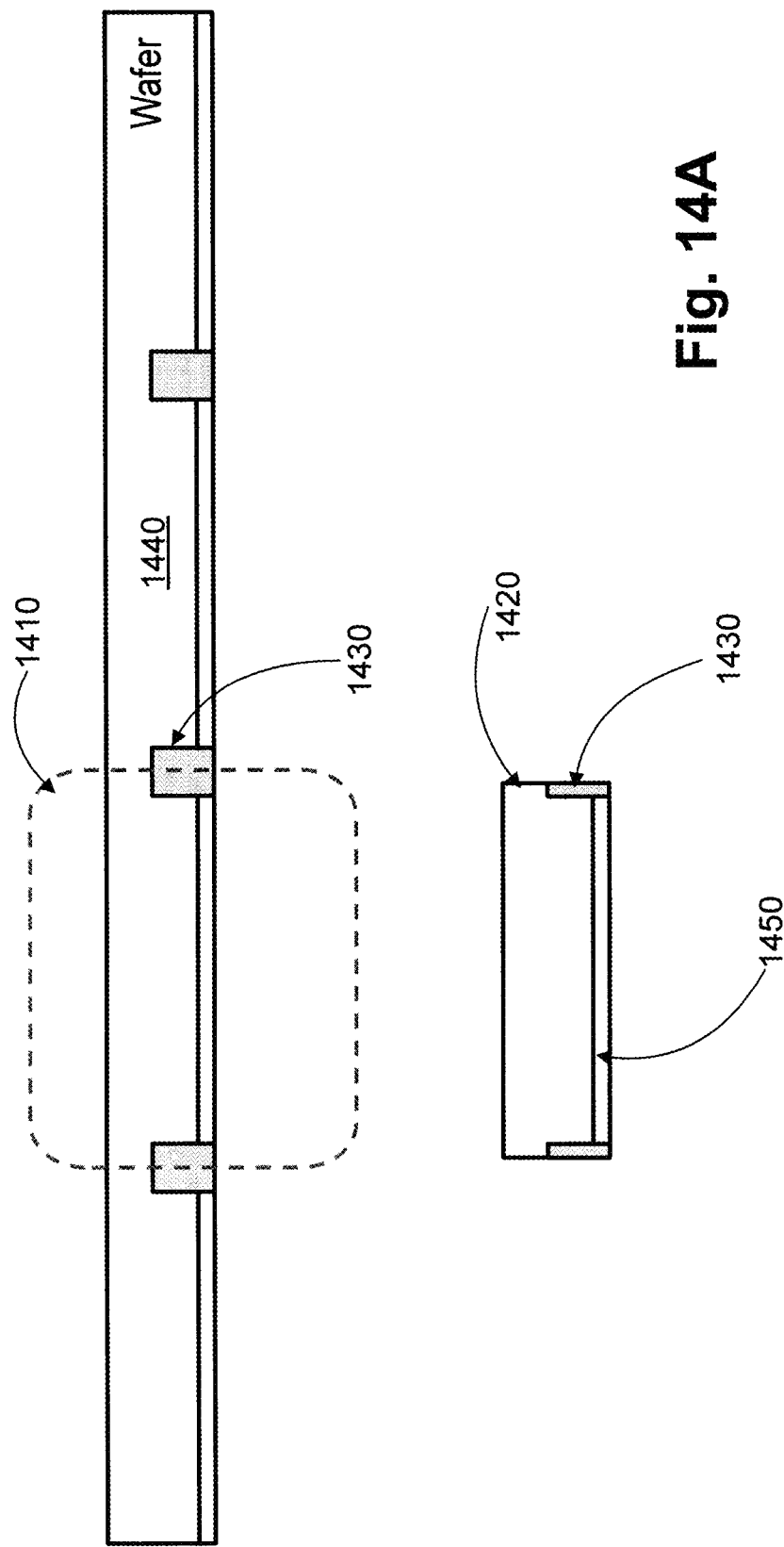
FIGS. 14A-14B respectively are a cross-sectional view and a 3-D bottom view of a singulated semiconductor unit, according to one embodiment.
Figure 14B:
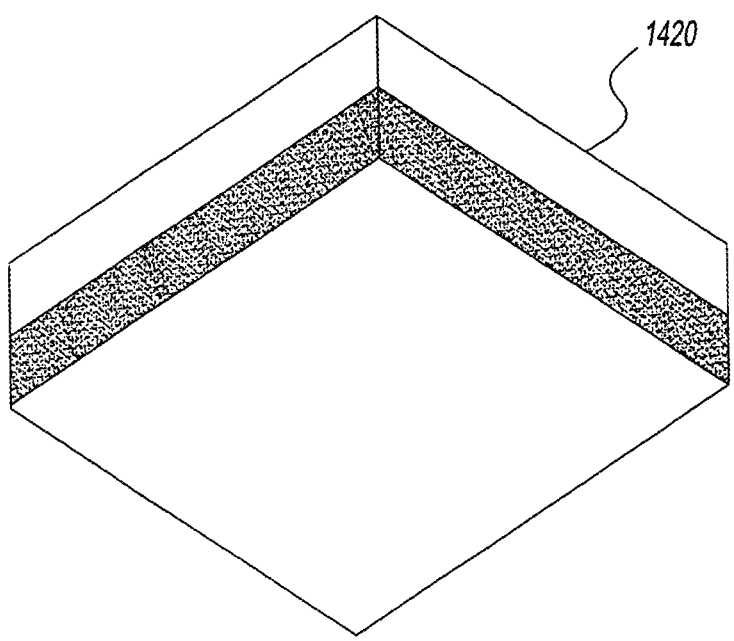

FIG. 14A illustrates that the mask tape 1310 of FIG. 13C has been removed and the semiconductor units are singulated 1410 to form an individual packaged semiconductor unit 1420. In one embodiment, a wafer saw penetrates through the protective material 1430 and cuts through the remainder of the wafer 1440. Other methods of wafer singulation include, but are not limited to etching, cutting, laser ablation, stealth dicing, and plasma dicing. The packaged semiconductor unit 1420 contains protective material 1430 that completely surrounds the lower periphery of the packaged semiconductor unit 1420, such that all edges of the active circuitry layer 1450 are protected by the protective material 1430. FIG. 14B is a bottom 3-dimensional view of the packaged semiconductor unit 1420.

FIG. 15 illustrates another embodiment for wafer-level processing of ICs intended for subsequent wire bonding. A wafer 1510 containing a plurality of ICs has an active circuitry layer 1520. A carry tape 1530 is adhered to the inactive surface of the wafer 1510. A plurality of first cuts or grooves 1540 are made in saw streets within the wafer 1510 active circuitry layer 1520. The wafer cuts or grooves 1540 can be formed by laser grooving, plasma etching, or mechanical sawing, for example. In one embodiment, the wafer cuts or grooves 1540 remove any passivation layer, metallization layers, and interlayer dielectric materials from the saw streets, and partially cut through the silicon substrate. A second cut or groove 1550 is made completely through the wafer 1510 and partially into the carry tape 1530. In an embodiment, the second cut or groove 1550 is made by wafer sawing. FIG. 15 illustrates that the first cut or groove 1540 is larger in width than the second cut or groove 1550. In one embodiment, the larger first groove 1540 is formed by laser grooving or plasma etching, while the second groove 1550 is formed by wafer sawing. The bulk of the carry tape 1530 is still in tack, and therefore, continues to hold the singulated semiconductor units in place, relative to one another.

In another embodiment, in lieu of the second cut or groove described above, the backside surface of the wafer can be back-grinded down to the top of the first groove. An adhesive carrier or other means of stabilizing the wafer can be used to hold the wafer in place during the back-grinding. This method has the advantage of a smaller final die.

Figure 16:
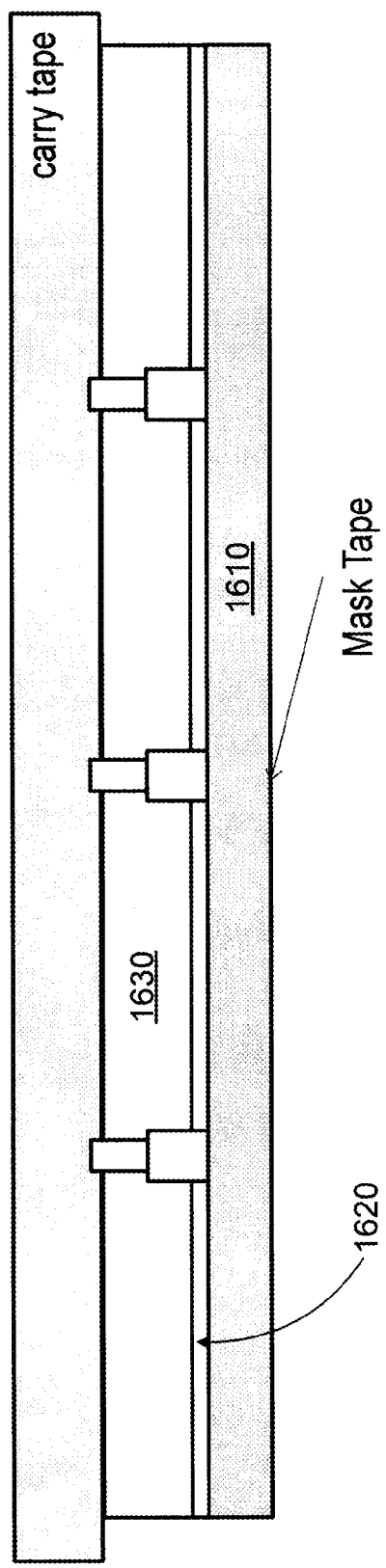
FIG. 16 is a cross-sectional view of a wafer with carry tape and mask tape applied, according to one embodiment.
Figure 17A:
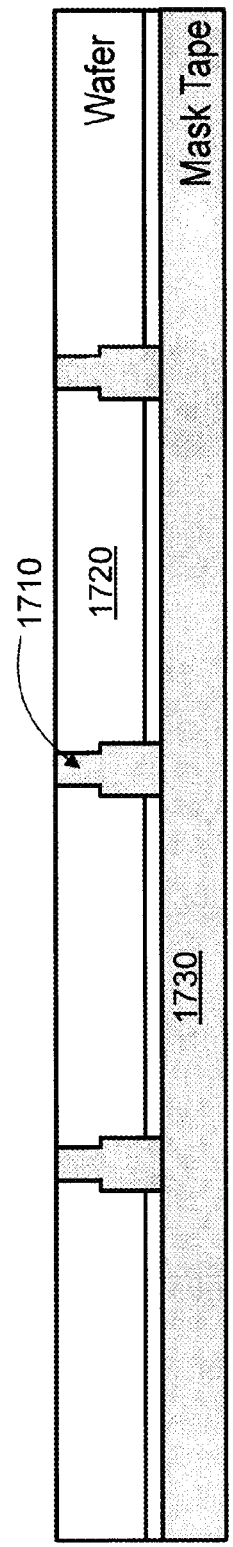
FIGS. 17A-17B illustrate cross-sectional views of a wafer with protective-filled saw streets, according to one embodiment.
Figure 17B:
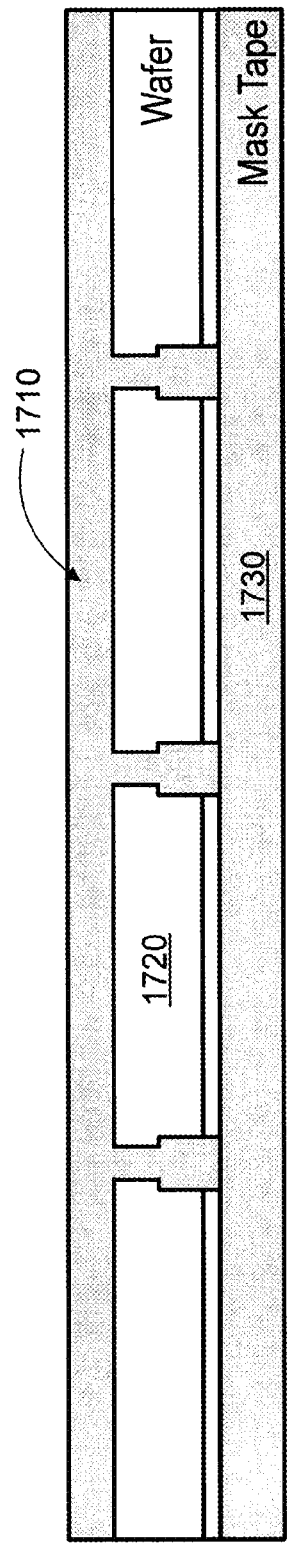

FIG. 16 illustrates a mask tape 1610 adhered to the active circuitry layer 1620 of the wafer 1630. FIG. 17A illustrates that the carry tape 1530 of FIG. 15 has been removed. Protective sealant material 1710 is filled in the saw streets from the back side of the wafer 1720. The mask tape 1730 provides a back-stop for the protective sealant material 1710. FIG. 17B illustrates another embodiment in which the protective sealant material 1710 is applied to the back inactive surface of the wafer, as well as within the saw streets. The protective sealant material 1710 includes, but is not limited to molding compound, thermoset epoxy, resin, or adhesive. The protective sealant material 1710 can be applied by molding, vacuum-assisted molding, immersion coating, spray coating, and spin-on coating. Other application methods are contemplated by embodiments described herein.

Figure 18A:
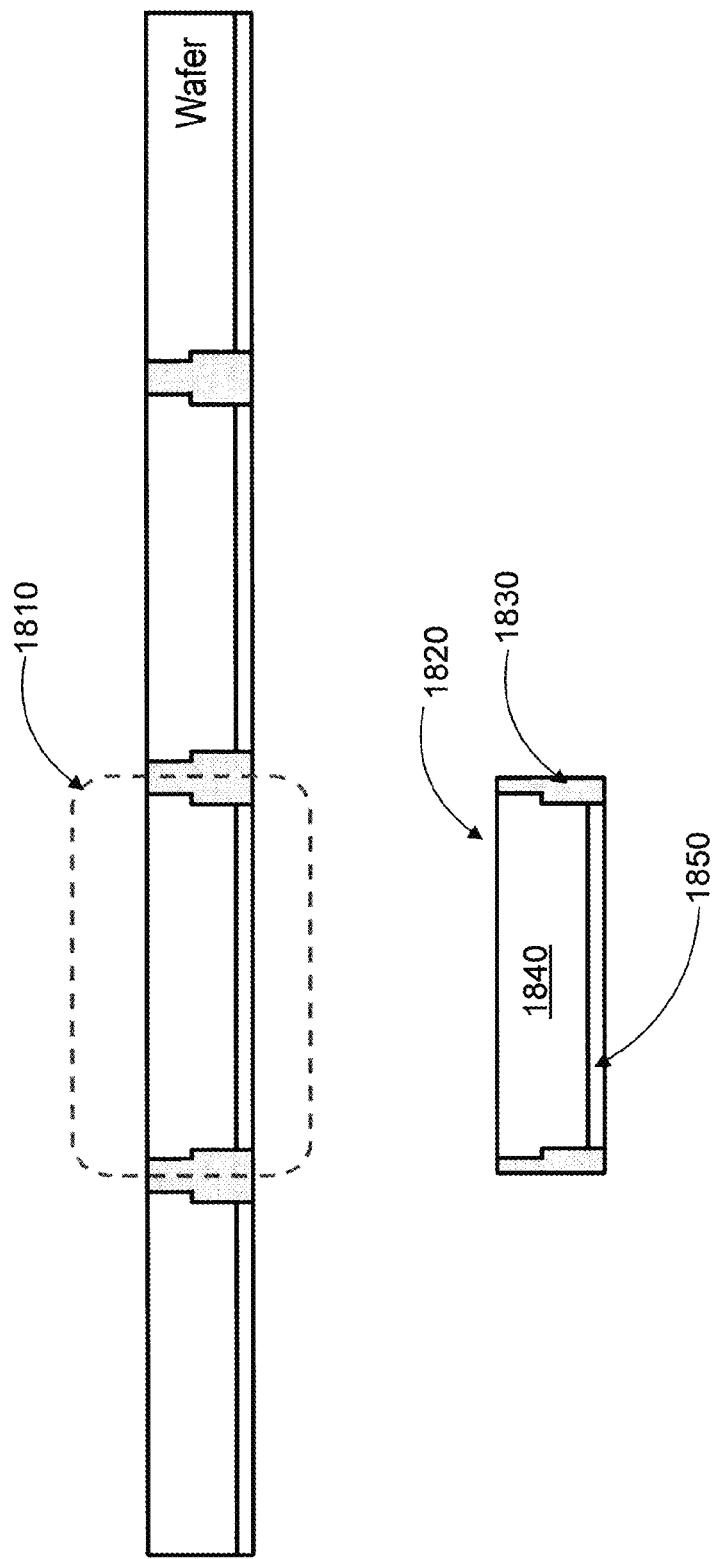
FIGS. 18A-18B respectively are a cross-sectional view and a 3-D bottom view of a singulated semiconductor unit, according to one embodiment.
Figure 18B:
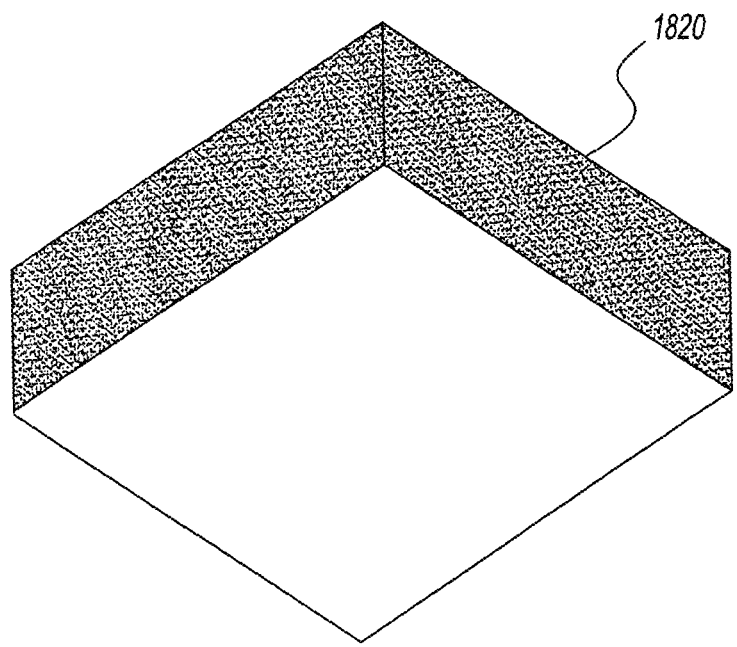

FIG. 18A is a cross-sectional view of the embodiment of FIG. 17A, in which the saw streets are filled with protective sealant material. The semiconductor units are singulated 1810 between the protective sealant material within the saw streets, wherein no circuitry is cut during the singulation 1810. The final packaged semiconductor unit 1820 illustrates that the protective sealant material 1830 completely surrounds the periphery of the IC 1840 to cover the side edges of the IC and the edges of the active circuitry layer 1850. FIG. 18B is a bottom 3-dimensional view of the packaged semiconductor unit 1820.

Figure 18D:
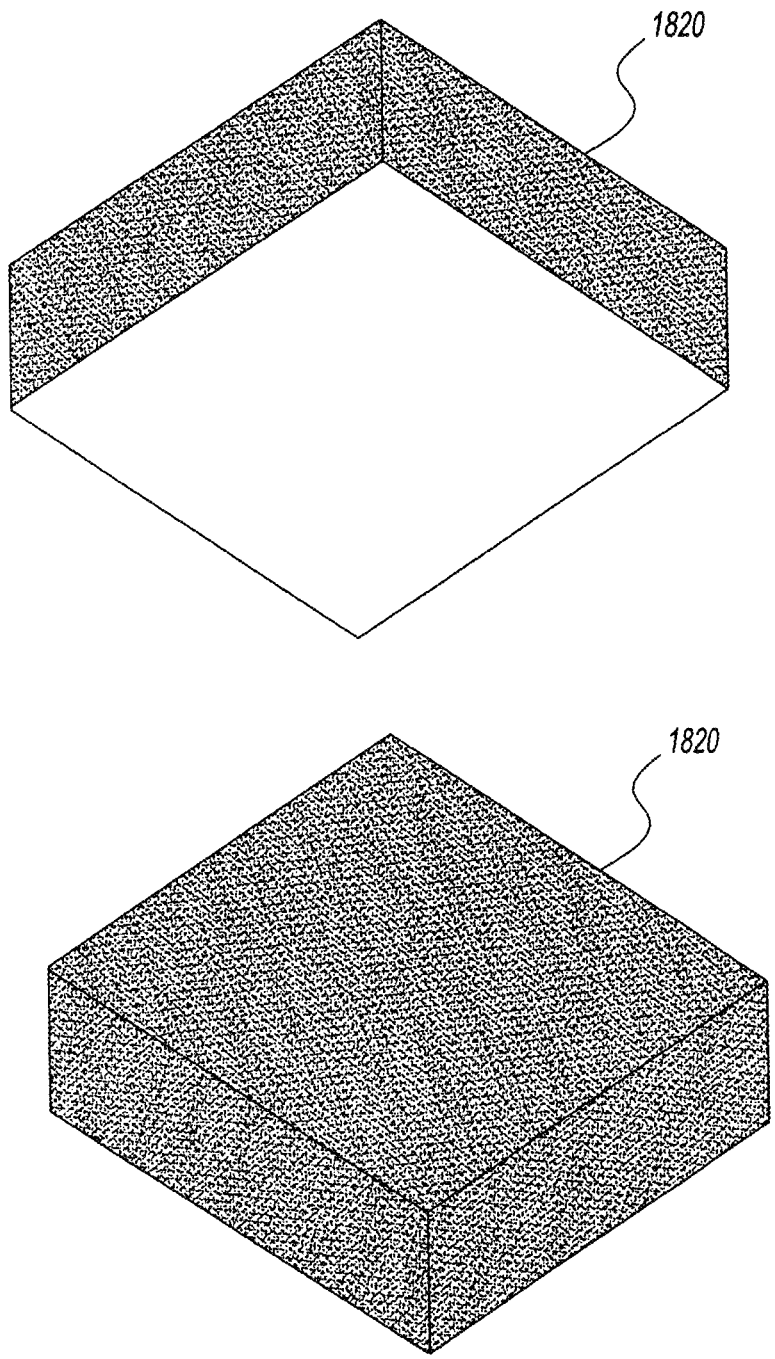

FIG. 18C is a cross-sectional view of the embodiment of FIG. 17B, in which the saw streets are filled and the back inactive surface of the wafer is covered with protective sealant material. The semiconductor units are singulated 1810 between the protective sealant material within the saw streets, wherein no circuitry is cut during the singulation 1810. The final packaged semiconductor unit 1820 illustrates that the protective sealant material 1830 completely surrounds the periphery and the back inactive surface of the IC 1840. The final packaged semiconductor unit 1820 is completely covered with protective sealant material 1830, except for the bottom surface of the active circuitry layer 1850. FIG. 18D is a bottom and top 3-dimensional view of the packaged semiconductor unit 1820.

An alternative embodiment will now be described with reference back to FIGS. 12A-FIG. 14. The wafer 1210 of FIG. 12A contains an active circuitry layer 1220. FIG. 12B illustrates a carry tape 1230 on the back side of the wafer 1210. First cuts or grooves 1240 are made through the active circuitry layer 1240 and partially through the silicon wafer between semiconductor units. The mask tape 1310, illustrated in FIG. 13A is not applied in this alternative embodiment. Instead, the protective sealant fill material 1370 of FIG. 13C is filled within the first cuts or grooves 1240, and also covers the active circuitry layer 1320. This results in a continuous layer of protective sealant fill material 1370 on the active surface of the entire wafer 1330.

A solder mask containing a plurality of openings that match the contact pads on the active surface of the semiconductor wafer is placed over the protective sealant fill material 1370 on the wafer. The solder mask can be made of a polymer or photoimageable material, which can be patterned when exposed to ultraviolet (UV) light. UV light exposes the protective sealant fill material 1370 through the openings in the solder mask. The solder mask is subsequently removed, and exposed areas of the protective sealant fill material 1370 are removed. Bonding wires can be connected to the contact pads on the active circuitry layer within the openings of the protective sealant fill material 1370.

Figure 19:
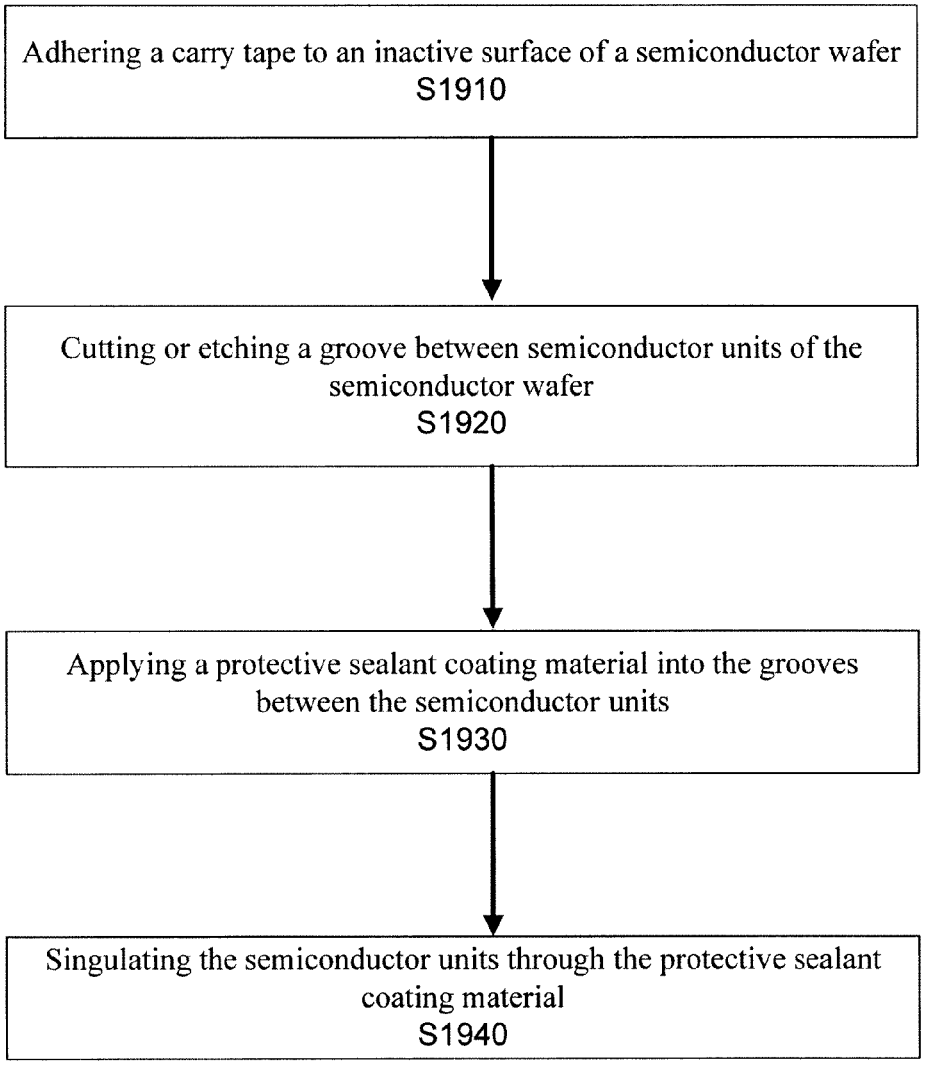
FIG. 19 is a flowchart for a method of manufacturing a semiconductor package, according to one embodiment.

With reference to FIG. 19, a method 1900 of manufacturing a semiconductor package will be described. A carry tape is adhered to an inactive surface of a semiconductor wafer in step S1910. A groove is cut or etched between semiconductor units of the semiconductor wafer in step S1920. The groove cuts or etches through an active circuitry layer of the semiconductor wafer. In one embodiment, the groove is formed with a combination of cutting and etching steps. A protective sealant coating material is applied into the grooves between the semiconductor units in step S1930. In one embodiment, the applying step occurs prior to connection of external conductive connectors to the semiconductor units. The semiconductor units are singulated through the protective sealant coating material in step S1940. In one embodiment, the method 1900 also includes adhering a film to external conductive connectors of the semiconductor wafer, and applying the protective sealant coating material around the external conductive connectors. In another embodiment, the method also includes cutting or etching the groove completely through the semiconductor wafer between the semiconductor units. In another embodiment, the method also includes irradiating and removing the protective sealant coating material exposed through openings in a mask, wherein the openings correspond to underlying bonding pads of the active circuitry layer.

The methods and devices described herein can be applied to wafer-level devices, as described above, or the methods and devices can be applied to reconstituted devices, as described below. Reconstituted devices are singulated from wafer form and subjected to a plurality of tests. The devices that fail one or more tests are discarded, and the devices that pass the tests are reassembled for further manufacturing. This provides the advantage of continued processing on good devices only, rather than carrying bad devices completely through the process and discarding them at the end of the process.

FIG. 20A illustrates a 3×8 array of reconstituted semiconductor devices 2010 adhered to an adhesive carrier 2020. FIG. 20A illustrates a rectangular array of reconstituted semiconductor devices 2010. However, other arrays are contemplated by embodiments described herein, such as a strip of devices, a square array of devices, or a reconstituted round wafer array of devices. FIG. 20A also illustrates the reconstituted semiconductor devices 2010 having a plurality of solder balls 2030 in a ball grid array (BGA) on the active surfaces of the devices. However, other external interconnects are contemplated by embodiments described herein, such as a pin-grid array, a column-grid array, or a plurality of contact pads configured for subsequent wire bonding.

Figure 20C:
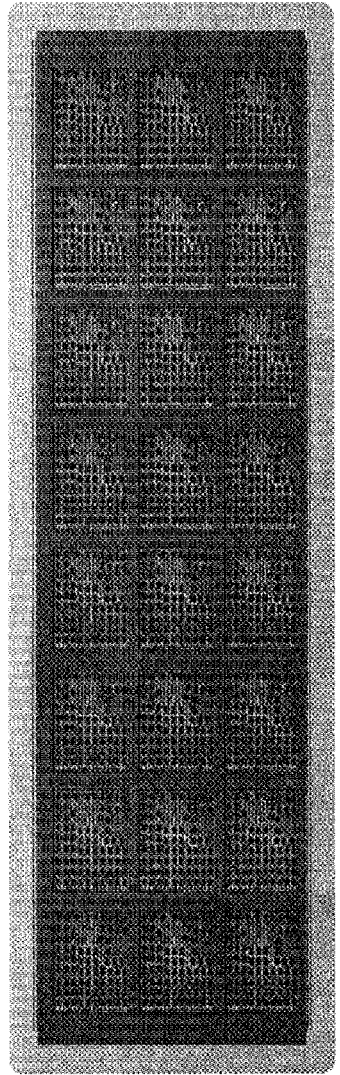
FIG. 20C illustrates the array of reconstituted semiconductor devices after laser ablation, according to one embodiment.

FIG. 20B illustrates a protective coating material 2040, such as a molding compound or epoxy, covering the solder balls 2030 and the active circuitry layer, as well as in between the reconstituted semiconductor devices 2010. FIG. 20C illustrates exposing a lower portion of the solder balls 2030.

In one embodiment, laser ablation is used to expose the solder balls 2030. Approximately one-half of the solder ball height is exposed through the molding compound. However, other exposure dimensions can be used according to the desired end product. In another embodiment, a film is placed over the bottom surfaces of the solder balls 2030. The molding compound 2040 is filled in between the film and the active surfaces of the reconstituted semiconductor devices 2010, as well as around the individual solder balls 2030.

Figure 20D:
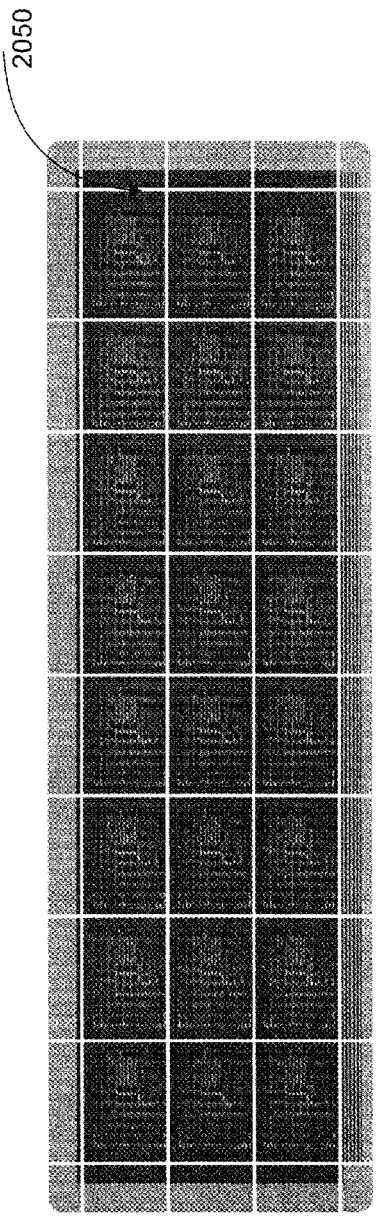
FIG. 20D illustrates singulation of the laser ablated array of reconstituted semiconductor devices, according to one embodiment.
Figure 20E:
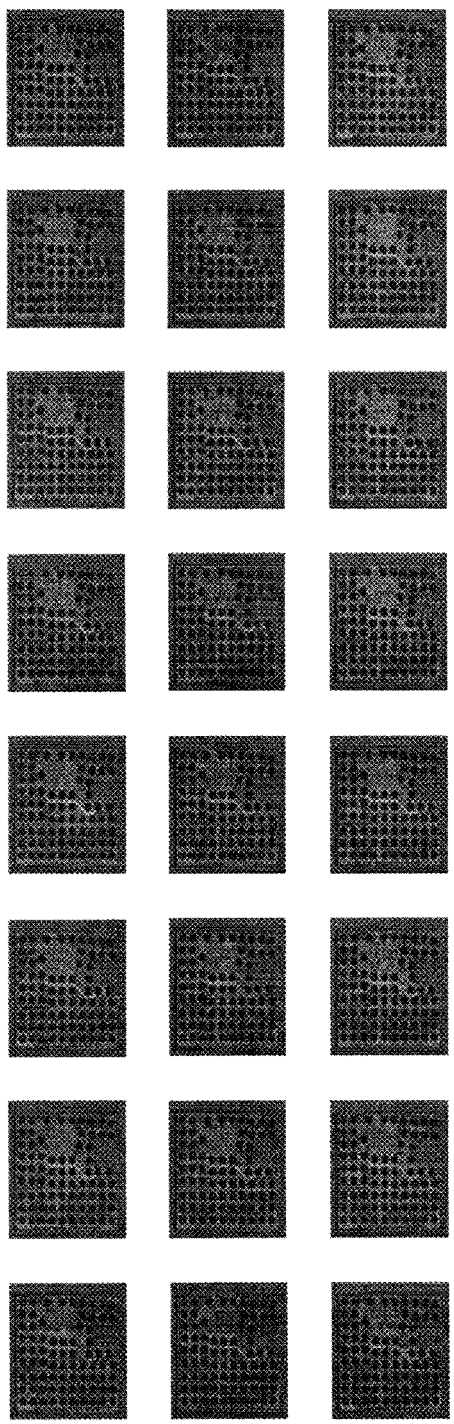
FIG. 20E illustrates individual packaged reconstituted semiconductor devices, according to one embodiment.

FIG. 20D illustrates singulating the reconstituted semiconductor devices 2010 into individual units 2050. Examples of an individual unit 2050 includes, but is not limited to a ball grid array (BGA) or a chip-scale package (CSP). The singulating can occur by one or more of sawing, cutting, or etching. The singulation occurs through the molding compound only, without cutting the reconstituted semiconductor devices 2010. The individual units 2050 are removed from the adhesive carrier 2020, as illustrated in FIG. 20E.

Figure 20F:
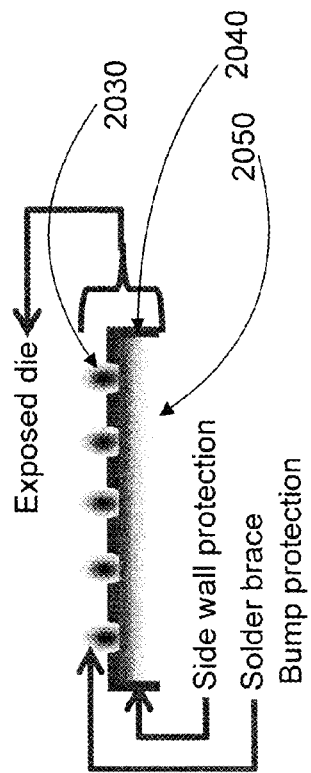
FIG. 20F illustrates a close-up view of the protective sealant coating of an individual packaged reconstituted semiconductor device, according to one embodiment.

FIG. 20F illustrates a cross-sectional view of an individual unit 2050. The molding compound 2040 resides along the sides of the individual unit 2050 and continues around the corner surfaces and inward towards the perimeter solder balls 2030 of the individual unit 2050. This provides the advantages of sealing the edge of the active circuitry layer to prevent delamination, and also provides structural support to the outside perimeter solder balls 2030.

A thickness of the sidewall molding compound can vary, depending upon the final package product. In one embodiment, the sidewall thickness of the molding compound ranges from 10 µm-90 µm. In one embodiment, a total height of a mold-injected semiconductor device, before removal of any molding compound, can be approximately 560 µm from the back side of the device to the top surface of the molded compound. The amount of molding compound to be removed by laser ablation or other methods can be 190 µm. This amount of molding compound removal exposes approximately one-half of the solder balls. The dimensions described above are given for exemplary purposes only, and other dimensions designed for a specific end product are contemplated by embodiments described herein.

Figure 21:
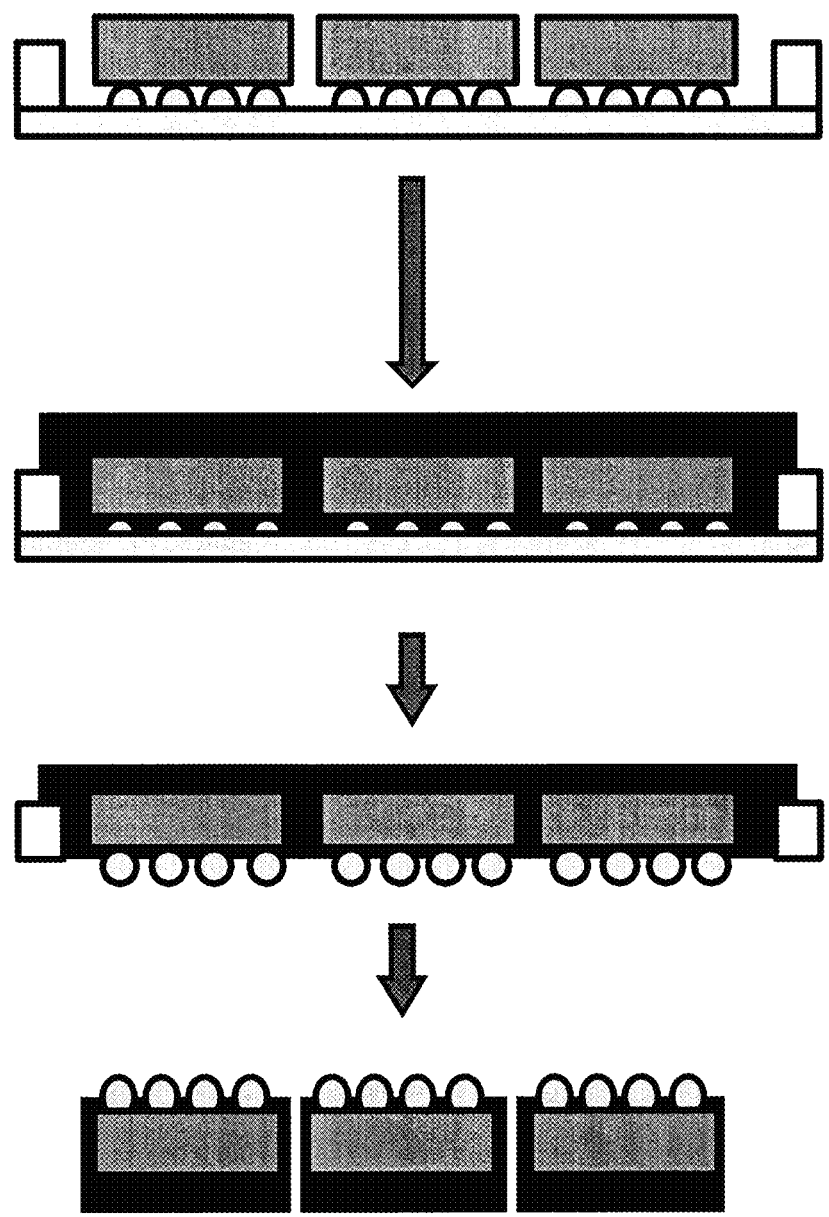
FIG. 21 illustrates a molding process of reconstituted semiconductor devices with solder balls adhered to an adhesive carrier, according to one embodiment.

FIG. 21 illustrates one embodiment in which solder balls of reconstituted semiconductor devices are adhered to an adhesive carrier. Molding compound fills the gaps between the reconstituted semiconductor devices, as well as between the active layer of each device and the adhesive carrier. FIG. 21 illustrates that molding compound also resides on the back inactive surfaces of the reconstituted semiconductor devices. Another embodiment includes covering the back surfaces with a film or tape, such that no molding compound is applied to the back surfaces. FIG. 21 further illustrates the adhesive carrier is removed, and the reconstituted semiconductor devices are singulated into individual units.

Figure 22A:
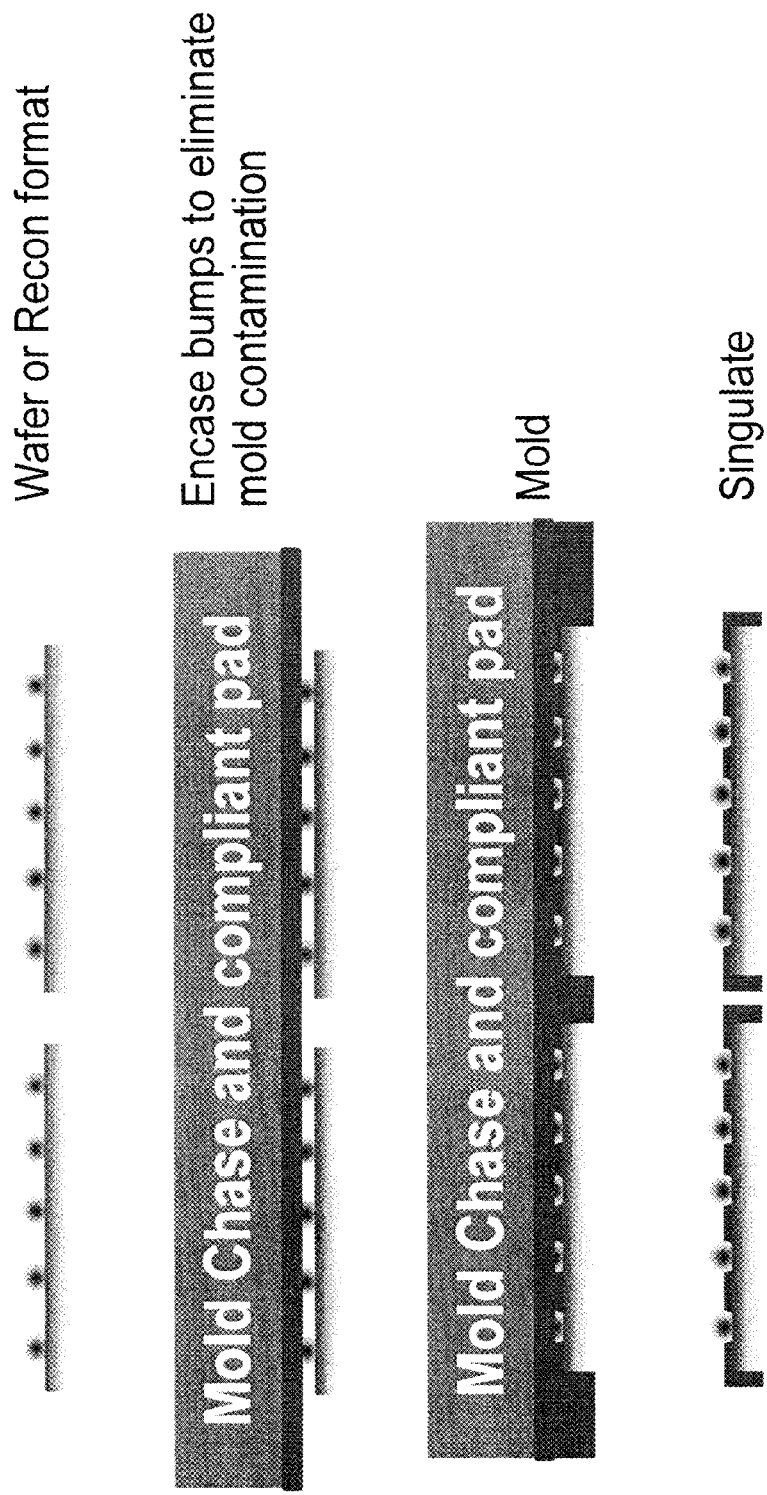
FIGS. 22A-22B illustrate a mold chase and compliant pad molding process of wafer or reconstituted semiconductor devices, according to one embodiment.

In other embodiments, the molding compound can be applied in an exposed die chase or by compression molding. FIG. 22A illustrates multiple semiconductor devices adhered to a carrier by their back side surfaces. The solder bumps are encased in a compliant pad, such that the upper halves of the solder bumps are covered and the lower halves of the solder bumps next to the dies are exposed for receiving a molding compound. After the molding compound has infiltrated the open spaces and has set, the mold chase and compliant pad are removed. The semiconductor devices are singulated into individual units.

Figure 22B:
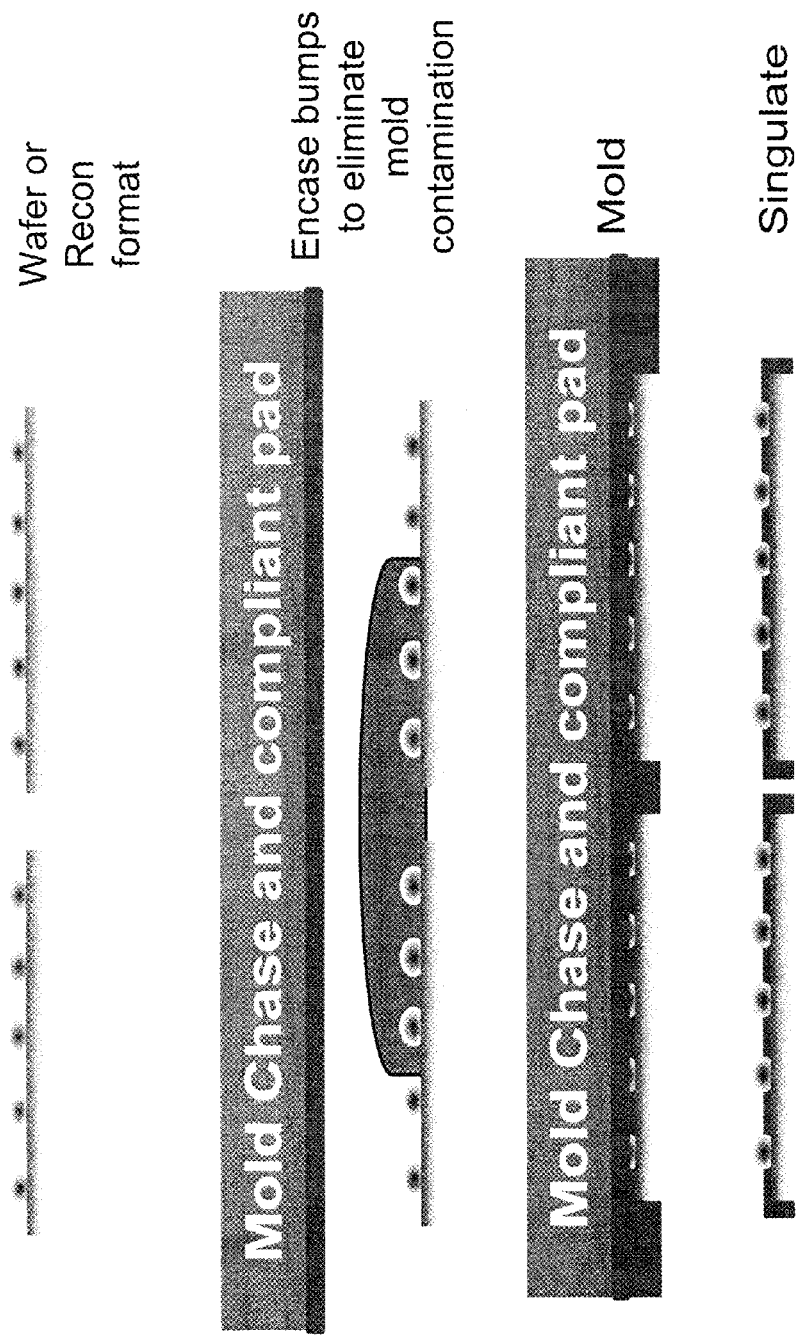

FIG. 22B illustrates a similar process as the FIG. 22A process, except the molding compound is applied near the center of the multiple devices before the mold chase and compliant pad are applied. The processes of FIGS. 22A and 22B could be applied to wafer-level semiconductor devices or to reconstituted semiconductor devices.

The versatility of embodiments described herein allows testing to be performed at several possible processing stages. Testing can be performed using a die probe after saw street encapsulation while in wafer form, after die reconfiguration and molding while in panel form, after the molded panel has been divided into strip form, or as a final test of the singulated IC unit. Testing flexibility provides cost savings due to different test platforms that different suppliers can utilize.

FIG. 23 is a flowchart of a method 2300 of manufacturing a semiconductor package. A plurality of semiconductor devices are adhered to an adhesive carrier in a strip or array format in step S2310. The format contains a gap between each adjacent pair of semiconductor devices. A mold compound is applied with the gaps in step S2320. The mold compound surrounds all exposed active circuitry edges. The plurality of semiconductor devices are singulated through the applied mold compound in step S2330.

Method 2300 can also include connecting external solder balls to corresponding contact pads of an active circuitry layer, and applying the mold compound on the active circuitry layer to surround the connected external solder balls. Method 2300 can also include one or more of the steps of applying the mold compound on the active circuitry layer between the active circuitry layer and a film applied to bottom surfaces of the external solder balls, laser ablating the mold compound applied to bottom surfaces of the external solder balls, applying the mold compound within the gaps and on the active circuitry layer by one of an exposed die chase or a compression mold, or marking the plurality of semiconductor devices on the mold compound applied to a backside surface of the plurality of semiconductor devices. In one embodiment, the plurality of semiconductor devices comprises reconstituted semiconductor devices.

A semiconductor device is handled many times and undergoes several processing and testing procedures. Conventional devices tend to form a chipped-out region near the edge of the active circuitry layer, especially when the devices are bumped. This chipped-out region tends to cause subsequent delamination of the circuitry layer from the die, which causes eventual failure of the device.

Embodiments described herein provide a more robust semiconductor device. The protective edge sealant seals the edges of the active circuitry layer all about the die on all four sides. The protective edge sealant extends onto the active circuitry layer to surround the external connectors, such as solder balls. This provides the additional benefit of solder ball support and protection for the solder balls located at the periphery of the device, which increases the reliability of the device. As a result of the decreased delamination and increased reliability, semiconductor packages can contain a larger die. As an example, given for exemplary purposes only, a conventional semiconductor package can have a die of approximately 5 mm×5 mm. A larger-sized conventional die risks a higher occurrence of chip-out and delamination during processing and testing. By using embodiments described herein, a die size of 8 mm×8 mm or 10 mm×10 mm can be used and still maintain minimal delamination and chip-out, and have increased reliability. A larger die using embodiments described herein also does not require connection to a substrate to provide stability or protection, which results in cost savings.

The methods and devices described herein are exemplary and are given to illustrate the features and processes of certain embodiments. Embodiments are not restricted to any particular order or to the exemplary order described herein.

Embodiments described herein for a semiconductor package can be used in many applications, including but not limited to the networking, mobile, wireless, wearable electronics, and broadband. In the networking application, the semiconductor packages described herein can be used in multi-core processors, knowledge-based processors, server message block (SMB) processors, encryption coprocessors, and security processors. In the mobile, wireless applications, and wearable applications, the semiconductor packages described herein can be used in 3G baseband processors, LTE baseband processors, mobile video processors, mobile graphics processors, application processors, touch controllers, wireless power, Internet of things (IoT) and wearable system-on-chips (SoCs), wireless video, and antennas. In the broadband applications, the semiconductor packages described herein can be used in cable set-top boxes (STBs), satellite STBs, Internet Protocol (IP) STBs, terrestrial STBs, ultra high definition (HD) processors, STB graphics processors, and STB security processors. These devices and systems can be used in products including but not limited to routers, smartphones, tablets, personal computers, and wearable devices such as watches, shoes, clothes, and glasses. In some embodiments, the devices and systems described herein can be used in a Wifi combination chip, an applications processor, a power management chip, and a Bluetooth chip.

The foregoing discussion discloses and describes merely exemplary embodiments. As will be understood by those skilled in the art, the present disclosure may be embodied in other specific forms without departing from the spirit or essential characteristics thereof. Accordingly, the disclosure of the present embodiments is intended to be illustrative, but not limiting of the scope of the embodiments, as well as the claims. The disclosure, including any readily discernible variants of the teachings herein, define in part, the scope of the foregoing claim terminology such that no subject matter is dedicated to the public.

The invention claimed is:

1. A semiconductor package, comprising:
   a semiconductor unit containing an active circuitry layer;
   a plurality of solder balls connected to the active circuitry layer, and configured to be connected to corresponding external conductive connectors; and
   a protective sealant coating filling grooved edges of the active circuitry layer, wherein
   the protective sealant coating contains an exterior wafer-singulated surface; and
   the plurality of solder balls extend through a plane of an outer surface of the protective sealant coating.

2. The semiconductor package of claim 1, wherein the exterior wafer-singulated surface includes one or more of sawed, etched, or laser modified edges.

3. The semiconductor package of claim 1, wherein the protective sealant coating at least partially covers a perimeter of a die of the semiconductor unit.

4. The semiconductor package of claim 1, further comprising:
   additional protective sealant coating surrounding the external conductive connectors on the active circuitry layer.

5. The semiconductor package of claim 1, further comprising:
   additional protective sealant coating on an inactive surface of the semiconductor unit.

6. The semiconductor package of claim 1, wherein the protective sealant coating reduces or eliminates a seal ring surrounding the semiconductor unit.

7. The semiconductor package of claim 1, wherein the exterior wafer-singulated surface includes one or more of sawed edges.

8. The semiconductor package of claim 1, wherein the exterior wafer-singulated surface includes one or more of etched edges.

9. The semiconductor package of claim 1, wherein the exterior wafer-singulated surface includes one or more of laser modified edges.

10. The semiconductor package of claim 1, wherein the protective sealant coating includes a thermal set adhesive, a molding compound using film-assisted molding, or an epoxy.

11. The semiconductor package of claim 1, wherein the protective sealant coating has a thickness that is greater than a thickness of the semiconductor unit.

12. The semiconductor package of claim 1, wherein the semiconductor unit further includes an inactive surface opposite to the active circuitry layer.

13. The semiconductor package of claim 12, wherein the protective sealant coating extends entirely along a plurality of sides of the semiconductor unit, the plurality of sides being in between the inactive surface and the active circuitry layer.

14. A semiconductor package, comprising:
   an active circuitry layer;
   a plurality of solder balls connected to the active circuitry layer, and configured to be connected to corresponding external conductive connectors; and
   a protective sealant coating filling grooved edges of the active circuitry layer, wherein
   the protective sealant coating contains an exterior wafer-singulated surface; and
   the plurality of solder balls extend through a plane of an outer surface of the protective sealant coating.

15. The semiconductor package of claim 14, wherein a surface of the protective sealant coating includes one or more of sawed, etched, or laser modified edges.

16. The semiconductor package of claim 14, further comprising:
   additional protective sealant coating surrounding the external conductive connectors on the active circuitry layer.

17. The semiconductor package of claim 14, wherein the protective sealant coating includes a thermal set adhesive, a molding compound using film-assisted molding, or an epoxy.

18. A semiconductor package, comprising:
   a semiconductor unit containing an active circuitry layer;
   a plurality of solder balls connected to the active circuitry layer; and
   a protective sealant coating filling grooved edges of the active circuitry layer, wherein
   the plurality of solder balls extend through a plane of an outer surface of the protective sealant coating.

19. The semiconductor package of claim 18, wherein the protective sealant coating includes a surface that has one or more of sawed, etched, or laser modified edges.

20. The semiconductor package of claim 18, wherein the protective sealant coating at least partially covers a perimeter of a die of the semiconductor unit.

21. The semiconductor package of claim 18, further comprising:
   additional protective sealant coating surrounding external conductive connectors on the active circuitry layer.

22. The semiconductor package of claim 18, further comprising:
   additional protective sealant coating on an inactive surface of the semiconductor unit.

23. The semiconductor package of claim 18, wherein the protective sealant coating reduces or eliminates a seal ring surrounding the semiconductor unit.

24. The semiconductor package of claim 18, wherein the protective sealant coating has a thickness that is greater than a thickness of the semiconductor unit.

25. The semiconductor package of claim 18, wherein the semiconductor unit further includes an inactive surface opposite to the active circuitry layer.

26. The semiconductor package of claim 25, wherein the protective sealant coating extends entirely along a plurality of sides of the semiconductor unit, the plurality of sides being in between the inactive surface and the active circuitry layer.

27. A semiconductor package, comprising:
a semiconductor unit containing an active circuitry layer;
a plurality of solder balls disposed directly on the active circuitry layer; and
a protective sealant coating filling grooved edges of the active circuitry layer, wherein the protective sealant coating contains an exterior wafer-singulated surface;
each of the plurality of solder balls extends through a plane of an outer surface of the protective sealant coating and has a substantially oval cross-sectional shape; and
each of the plurality of solder balls are disposed on a same plane.

28. The semiconductor package of claim 27, wherein the exterior wafer-singulated surface includes one or more of sawed, etched, or laser modified edges.

29. The semiconductor package of claim 27, wherein the protective sealant coating at least partially covers a perimeter of a die of the semiconductor unit.

30. The semiconductor package of claim 27, wherein the protective sealant coating has a thickness that is greater than a thickness of the semiconductor unit.

31. The semiconductor package of claim 27, wherein
the semiconductor unit further includes an inactive surface opposite to the active circuitry layer; and
the protective sealant coating extends entirely along a plurality of sides of the semiconductor unit, the plurality of sides being in between the inactive surface and the active circuitry layer.

* * * * *